(12) United States Patent
Hayashi et al.

(10) Patent No.: US 9,953,853 B2
(45) Date of Patent: Apr. 24, 2018

(54) SUBSTRATE TRANSPORT APPARATUS

(71) Applicant: TOKYO ELECTRON LIMITED, Tokyo (JP)

(72) Inventors: Masato Hayashi, Koshi (JP); Koudai Higashi, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 354 days.

(21) Appl. No.: 14/759,824

(22) PCT Filed: Jan. 31, 2014

(86) PCT No.: PCT/JP2014/052305
§ 371 (c)(1),
(2) Date: Jul. 8, 2015

(87) PCT Pub. No.: WO2014/119740
PCT Pub. Date: Aug. 7, 2014

(65) Prior Publication Data
US 2015/0340258 A1 Nov. 26, 2015

(30) Foreign Application Priority Data

Feb. 4, 2013 (JP) ................. 2013-019580

(51) Int. Cl.
*H01L 21/677* (2006.01)
*H01L 21/67* (2006.01)
*H01L 21/687* (2006.01)

(52) U.S. Cl.
CPC .. *H01L 21/67265* (2013.01); *H01L 21/67288* (2013.01); *H01L 21/67712* (2013.01);
(Continued)

(58) Field of Classification Search
CPC ................................................. H01L 21/67778
See application file for complete search history.

(56) References Cited

U.S. PATENT DOCUMENTS 6,298,282 B1 10/2001 Guldi et al.
6,473,157 B2 * 10/2002 Nakahara ............ G03F 7/70741
355/53
(Continued)

FOREIGN PATENT DOCUMENTS

JP 2000-056819 A1 2/2000
JP 2002-009126 A1 1/2002
(Continued)

OTHER PUBLICATIONS

International Search Report (Application No. PCT/JP2014/052305) dated Mar. 4, 2014.
(Continued)

*Primary Examiner* — Jonathan Snelting
(74) *Attorney, Agent, or Firm* — Burr & Brown, PLLC

(57) ABSTRACT

A substrate transport apparatus for detecting with high accuracy rubbing between a substrate held in a substrate holding tool, and a support which transports a substrate. The substrate transport apparatus includes: a stage for placing thereon the substrate holding tool; a substrate transport mechanism including the support for the substrate, and a back-and-forth movement mechanism for moving the support, the mechanism configured to transfer a substrate to/from the substrate holding tool; a lifting mechanism for moving the support up and down with respect to the substrate holding tool; a sound amplifying section for amplifying a contact sound generated by contact between a substrate held in the substrate holding tool and the support; and a detection section for detecting rubbing between a substrate and the support based on a detection signal from a vibration sensor which detects a solid-borne sound, propagating through the substrate holding tool, and outputs the detection signal.

9 Claims, 30 Drawing Sheets

(52) U.S. Cl.
CPC .. *H01L 21/67724* (2013.01); *H01L 21/67772* (2013.01); *H01L 21/67775* (2013.01); *H01L 21/67778* (2013.01); *H01L 21/68707* (2013.01)

(56) References Cited

U.S. PATENT DOCUMENTS

| | | | |
|---|---|---|---|
| 7,750,819 B2 * | 7/2010 | Lim | G01M 7/025 340/686.1 |
| 8,688,246 B2 * | 4/2014 | Fujii | H01L 21/67253 700/21 |
| 2001/0051088 A1 | 12/2001 | Park et al. | |
| 2005/0200105 A1 | 9/2005 | Mihara et al. | |
| 2006/0215347 A1 | 9/2006 | Wakabayashi | |
| 2008/0148857 A1 | 6/2008 | Furukawahara et al. | |

FOREIGN PATENT DOCUMENTS

| | | |
|---|---|---|
| JP | 2004-172287 A1 | 6/2004 |
| JP | 2005-254921 A1 | 9/2005 |
| JP | 2006-278396 A1 | 10/2006 |
| JP | 2010-245476 A1 | 10/2010 |
| JP | 2012-249228 A1 | 12/2012 |

OTHER PUBLICATIONS

International Preliminary Report on Patentability (Application No. PCT/JP2014/052305) dated Aug. 13, 2015.
Japanese Office Action (Application No. 2013-019580) dated Apr. 19, 2016 (with English translation).

\* cited by examiner

US 9,953,853 B2

SUBSTRATE TRANSPORT APPARATUS

CROSS-REFERENCE TO RELATED APPLICATION

This application claims the priority benefit of Japanese Patent Application No. 2013-019580, filed on Feb. 4, 2013, the disclosure of which is incorporated herein by reference in its entirety.

TECHNICAL FIELD

The present invention relates to a substrate transport apparatus for transferring a substrate to/from a substrate holding tool which holds a number of substrates in a shelf-like arrangement.

BACKGROUND ART

In a semiconductor manufacturing factory, wafers as semiconductor substrates are stored in a substrate storage container (carrier), and the substrate storage container is transported to a semiconductor manufacturing apparatus. The semiconductor manufacturing apparatus includes a carry-in/carry-out block for carrying the substrate storage container into/out of the semiconductor manufacturing apparatus, and a processing block for performing processing of a wafer. Widely used as the substrate storage container is a closed-type container composed of a container body and a lid provided at the front of the container body. A number of vertically spaced-apart wafers are stored in the container body.

A transport robot having a fork for supporting the back surface of a wafer is provided in the carry-in/carry-out block. A wafer is transferred between the substrate storage container and the processing block by allowing the fork to enter/exit the substrate storage container. Before starting the operation of the semiconductor manufacturing apparatus or during adjustment of the apparatus, a worker, either visually or by using a measuring jig, obtains a parameter of a height position which serves as a benchmark upon entry of the fork into the substrate storage container. This work is called teaching. During the manufacturing of a semiconductor product, the transport robot is driven based on the parameter obtained by the work so that undue contact (interference) between a wafer and the fork does not occur upon the above-described transfer of the wafer.

There is an individual difference in the shape of the substrate storage container. Some wafers stored in the substrate storage container can be warped. Deformation over time can occur in a mechanism involved with the above-described transfer of a wafer, such as the transport robot or a stage for placing the substrate storage container on it. Further, there is a possibility of the occurrence of a human error in setting of the above parameter. It is possible that due to these causes, contact between the fork and a wafer in the substrate storage container can occur when the fork moves back and forth with respect to the substrate storage container upon transfer of the wafer; and the fork can rub against the front or back surface of the wafer, thereby scratching the surface and generating particles. The longer it takes to detect such rubbing, the larger is the number of such damaged wafers with the progress of a process for manufacturing products in the semiconductor manufacturing apparatus. Quick detection of such rubbing is therefore required.

Patent document 1 describes a technique which involves providing a vibration sensor in a stage for a substrate storage container, and detecting collision of a wafer with a substrate mounting section in the substrate storage container based on the vibration acceleration or the frequency component of vibration detected by the vibration sensor. However, the above-described rubbing between a wafer and the fork is generally very weak, and cannot be detected with high accuracy by the technique of patent document 1. Further, as will be described below, a substrate storage container can vibrate due to various causes other than contact between a wafer and a fork. There is, therefore, a demand to more accurately detect rubbing between a wafer and a fork while preventing erroneous detection due to various causes.

PRIOR ART DOCUMENT

Patent Document

Patent document 1: Japanese Patent Laid-Open Publication No. 2006-278396

SUMMARY OF THE INVENTION

Problems to be Solved by the Invention

The present invention has been made in view of the above situation. It is therefore an object of the present invention to provide a technique for detecting with high accuracy rubbing between a substrate, held in a substrate holding tool which holds a number of substrates in a shelf-like arrangement, and a support which transports a substrate while supporting the back surface of the substrate.

Means for Solving the Problems

A substrate transport apparatus according to the present invention comprises: a stage for placing thereon a substrate holding tool for holding a number of substrates in a shelf-like arrangement; a substrate transport mechanism including a support for supporting the lower surface of a substrate, and a back-and-forth movement mechanism for moving the support back and forth, said mechanism being configured to transfer a substrate to/from the substrate holding tool placed on the stage; a lifting mechanism for moving the support up and down with respect to the substrate holding tool; a sound amplifying section for amplifying a contact sound generated by contact between a substrate held in the substrate holding tool and the support; and a detection section for detecting rubbing between a substrate and the support based on a detection signal from a vibration sensor which detects a solid-borne sound, propagating through the substrate holding tool, and outputs the detection signal.

Advantageous Effects of the Invention

The substrate transport apparatus according to the present invention is provided with a sound amplifying section for amplifying the sound of contact between the support for supporting the back surface of a substrate in the substrate transport mechanism and a substrate held in the substrate holding tool. Further, the detection section detects rubbing between a substrate and the support based on the output from the vibration sensor which detects a solid-borne sound that propagates through the substrate holding tool. Compared to an air-borne sound, a solid-borne sound is less subject to attenuation during its propagation. The substrate transport

DESCRIPTION OF THE PREFERRED EMBODIMENTS

Figure 1:
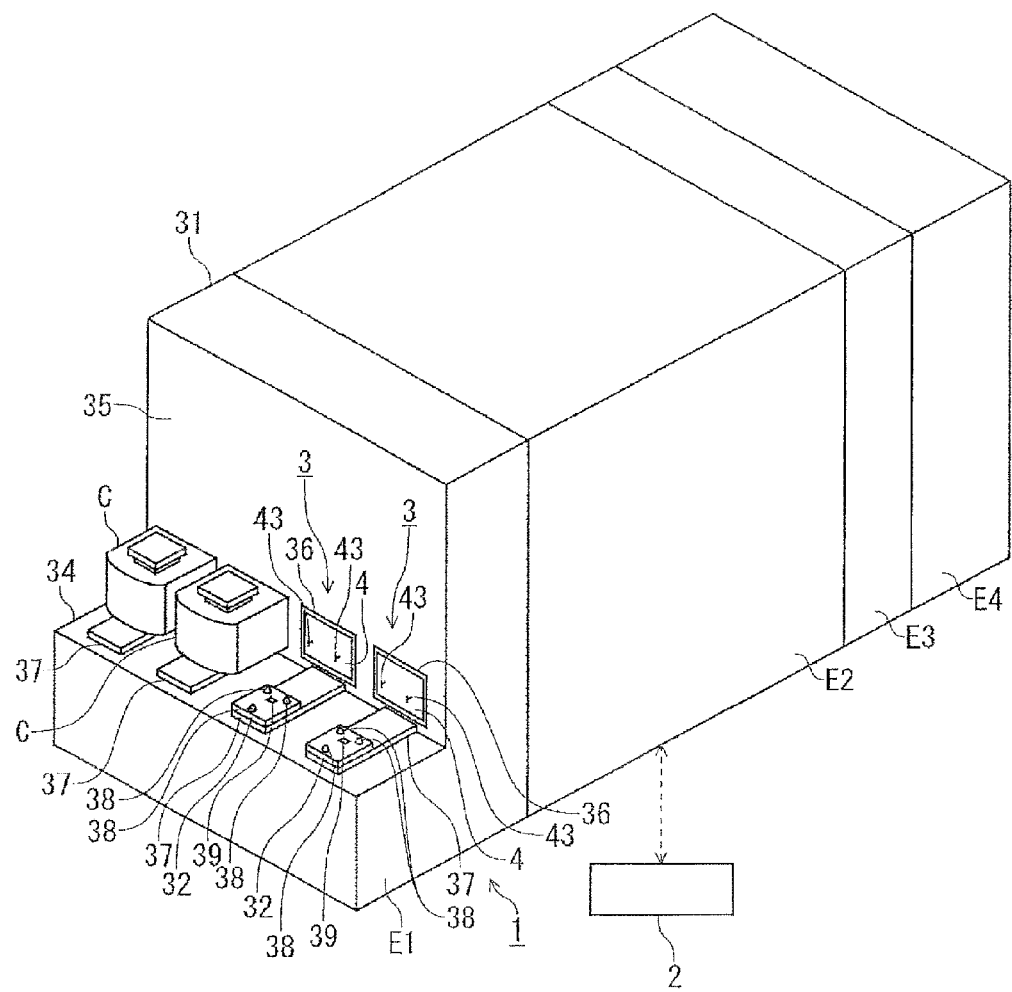
FIG. 1 is a perspective view of a coating/developing apparatus in which the present invention is applied.

A coating/developing apparatus 1 in which the present invention is applied will now be described with reference to FIG. 1. FIG. 1 is a perspective view of the coating/developing apparatus 1. The coating/developing apparatus 1 is installed in a clean room in a semiconductor manufacturing factory, and consists of a carrier block E1, a processing block E2 and an interface block E3 which are connected linearly. An exposure apparatus E4 is connected to the interface block E3 on the side opposite to the processing block E2. A transport area for a carrier C lies outside the coating/developing apparatus 1. The carrier C, which is a substrate storage container, is a holding tool which holds a large number of wafers W in a vertical shelf-like arrangement, and is transported in the transport area by a not-shown carrier transport mechanism.

The following is a brief description of the function of each block. The carrier block E1 is a block to transfer the carrier C between it and the carrier transport mechanism. Further, the carrier block E1 transfers a wafer N between the carrier C, which has been transported to the carrier block E1, and the processing block E2. The carrier block E1 corresponds to a substrate transport apparatus according to the present invention.

The processing block E2 is a block to perform various liquid treatments, such as resist coating and development, and heat treatment on a wafer W. The exposure apparatus E4 exposes a resist film which has been formed on a wafer W in the processing block E2. The interface block E3 transfers a wafer W between the processing block E2 and the exposure apparatus E4. A wafer W which has been carried out of the carrier C is subjected to resist coating treatment and then to heat treatment in the processing block E2. Thereafter, the wafer W is subjected to exposure in the exposure apparatus E4, and to heat treatment and development in the processing block E2. The wafer W is then returned to the carrier C.

The coating/developing apparatus 1 is provided with a control section 2. The control section 2 is a computer which sends control signals to components of the coating/developing apparatus 1 to control the components so that they perform transport of a wafer W in the carrier C and in the apparatus 1, transport of a wafer W between the blocks, operations on a wafer W in the blocks, and the below-described detection of rubbing between a transport robot 44 provided in the carrier block E1 and a wafer W in the carrier C. The control section 2 will be described in detail below.

The carrier block E1 will now be described further with reference also to the cross-sectional plan view of FIG. 2, the perspective view of FIG. 3 and the vertical cross-sectional side view of FIG. 4. For convenience of description, a direction from the interface block E3 toward the carrier block E1 is herein referred to as "backward", while a direction from the carrier block E1 toward the interface block E3 is referred to as "forward". The carrier block E1 includes a chassis 31 which constitutes four loading ports 3 each for transferring a carrier C between it and the carrier transport mechanism and transferring a wafer W between the carrier C and the interior of the coating/developing apparatus 1.

In addition to the chassis 31, each loading port 3 also comprises a stage 32 for placing the carrier on it, a transport opening 33 for a wafer W, and a door 4 for opening/closing the transport opening 33. A lower portion of the chassis 31 projects backward, forming a step portion 34. The stages 32 of the loading ports 3 are arranged laterally on the step portion 34. The transport opening 33 of each loading port 3 opens in the wall surface 35 of the chassis 31, located forward of the stage 32. A recessed portion 36 is formed in the wall surface 35 along the periphery of each transport opening 33.

Figure 4:
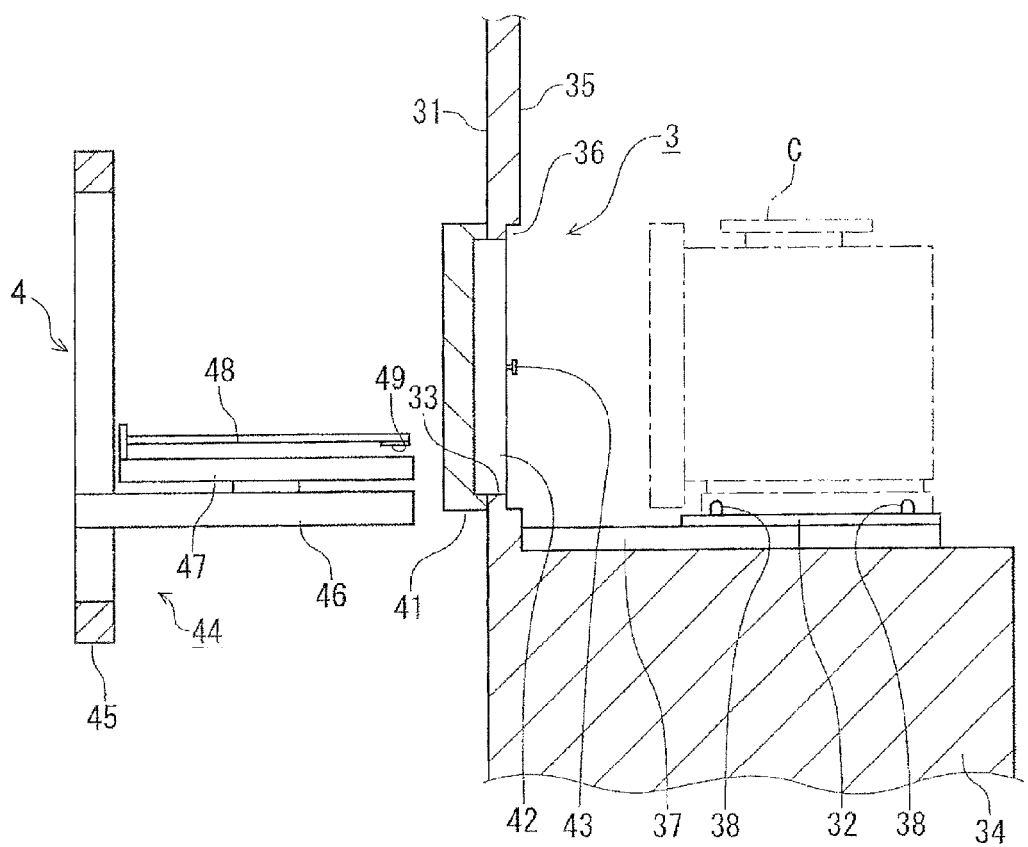
FIG. 4 is a vertical cross-sectional side view of the carrier block.
Figure 5:
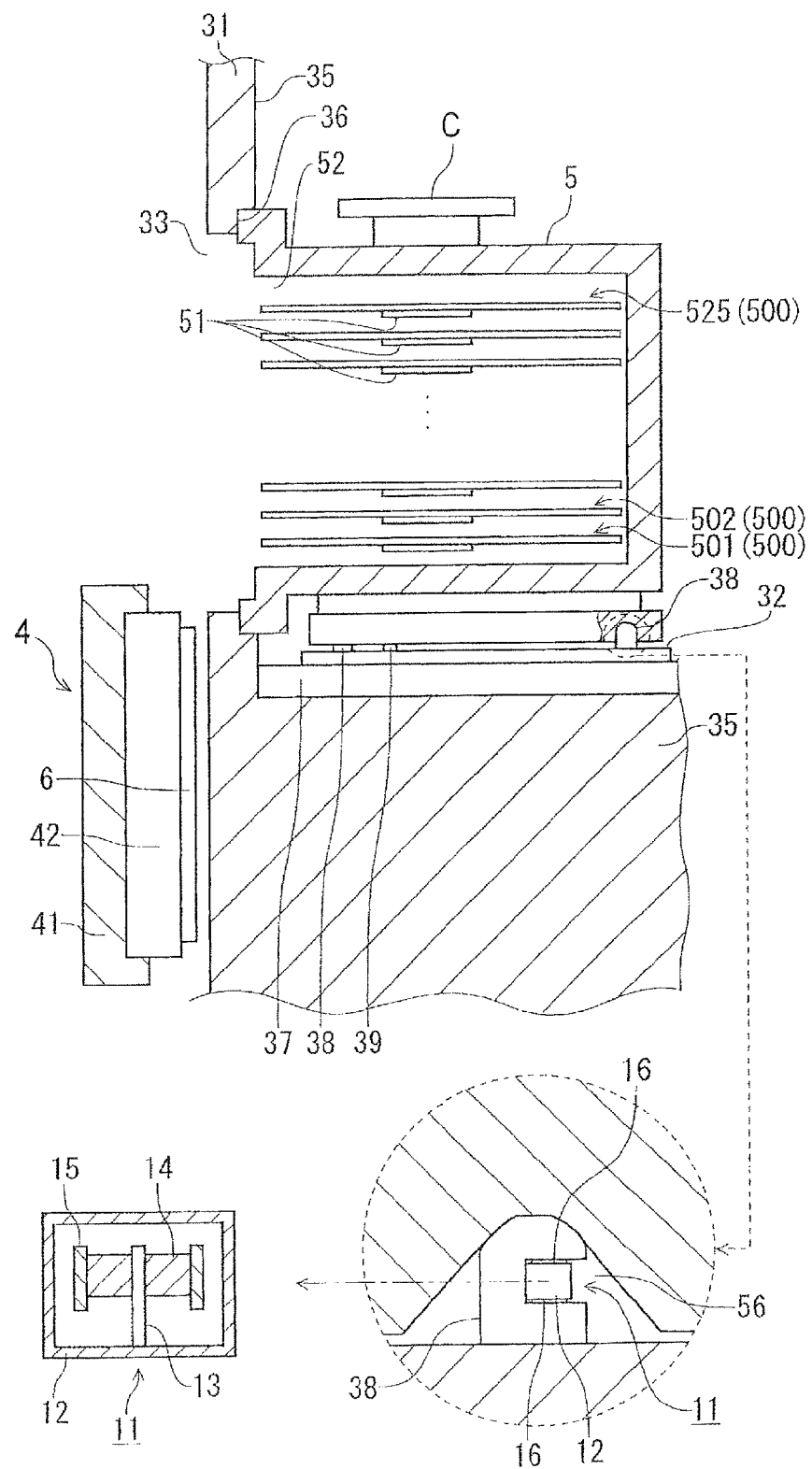
FIG. 5 is a vertical cross-sectional side view of the carrier block and a vibration sensor.

The stage 32 moves the carrier C between a backward position shown by the chain lines in FIG. 4 and a forward position shown in FIG. 5. In the drawings, reference numeral 37 indicates a movement mechanism for moving the stage 32 forward and backward. Three upwardly-projecting support pins 38 for preventing displacement of the carrier C on the stage 32 are provided on the surface of the stage 32. Reference numeral 39 indicates a hook which is projectable/retractable from the surface of the stage 32. When the carrier C is placed on the stage 32, the hook projects from the surface of the stage 32 to fix the container body 5 of the carrier C on the stage 32.

Figure 6:
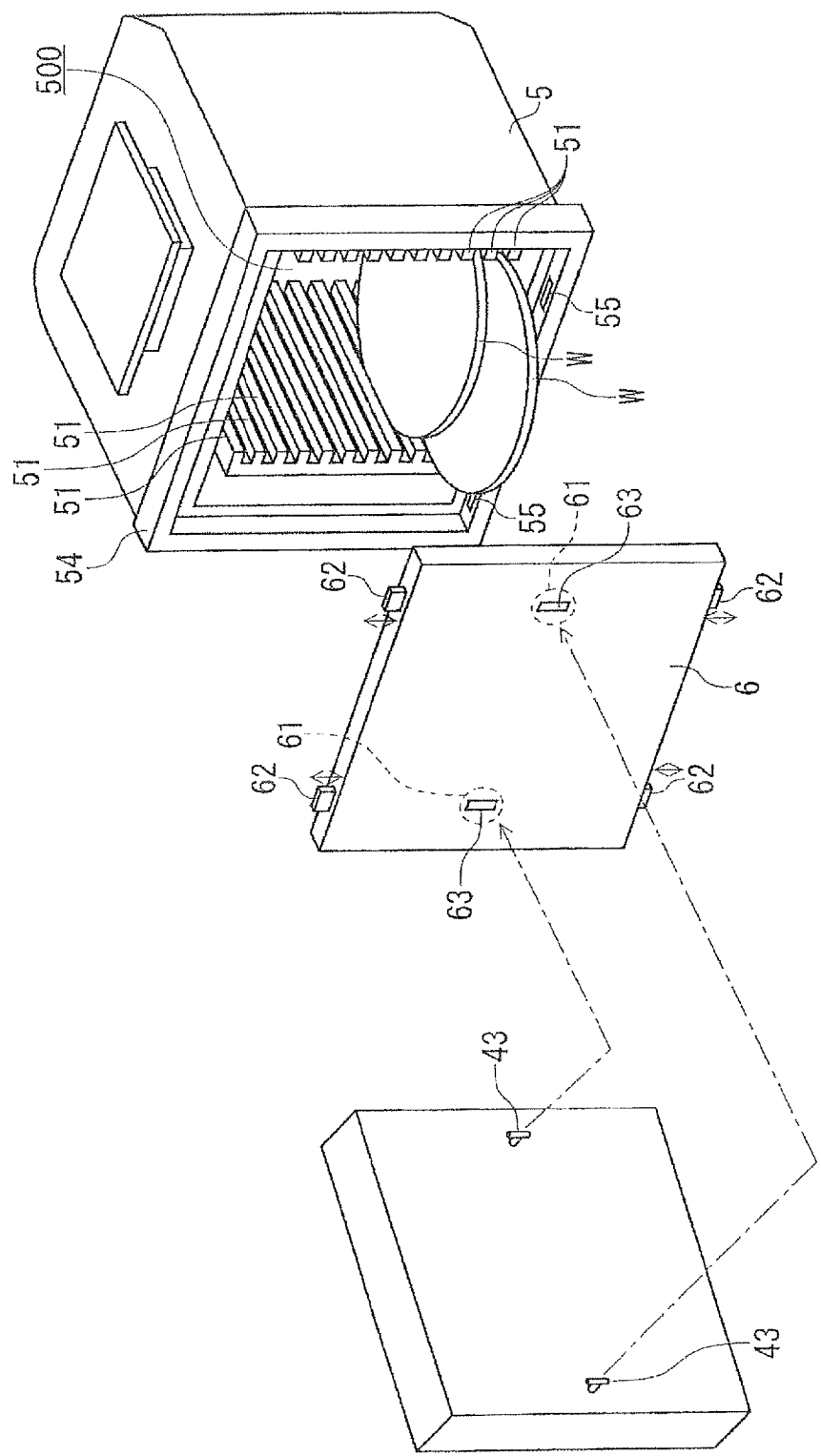
FIG. 6 is a perspective view of a door and a carrier, provided in the carrier block.

The carrier C will now be described with reference also to the perspective view of FIG. 6. The carrier C is composed of the container body 5 and a lid 6 which is attachable/detachable to/from the container body 5. In the interior of the container body 5, a large number of support portions 51, each for supporting a peripheral portion of the back surface of a wafer W, are provided vertically in multiple stages on the opposing side walls, so that wafers W are to be stored in a shelf-like arrangement in the container body 5. The space over each support portion 51 is defined as a slot 500 which is a storage space for a wafer W. For example, 25 pairs of slots 500 are provided in the container body 5 (though less than 25 pairs of slots 500 are depicted in the drawings for convenience). In order to distinguish between the pairs of slots 500, the slot pairs may sometimes be numbered as 501, 502 . . . 525, beginning at the lowest pair.

A wafer take-out opening 52 is formed in the front of the container body 5. The take-out opening 52 is closed by the lid 6. In the drawings, reference numeral 54 indicates a frame portion around the take-out opening 52. Engagement grooves 55 are formed in the inner periphery of the frame portion 54. As shown in FIG. 5, holes 56 are provided in the bottom of the container body 5. By inserting the support pins 38 of the stage 32 into the holes 56, the container body 5 is supported in a floating state slightly above the surface of the stage 32.

Returning to FIG. 6, right and left rotary portions 61 are provided in the lid 6, while vertically-extending linear movement portions 62 are provided above and below the rotary portions 61. A keyhole 63 into which the below-described latch key 43 is inserted is provided in each rotary portion. 61; the rotary portion 61 rotates by rotation of the latch key 43 inserted into the keyhole 63. By the rotation of the rotary portions 61, the linear movement portions 62 switch between a state in which the front ends project from the top and bottom surfaces of the lid and a state in which the front ends are retracted into the lid 6. The front ends of the linear movement portions 62, in the state projecting from the lid 6, engage the engagement grooves 55 of the container body 5, whereby the lid 6 is locked into the container body 5.

Figure 3:
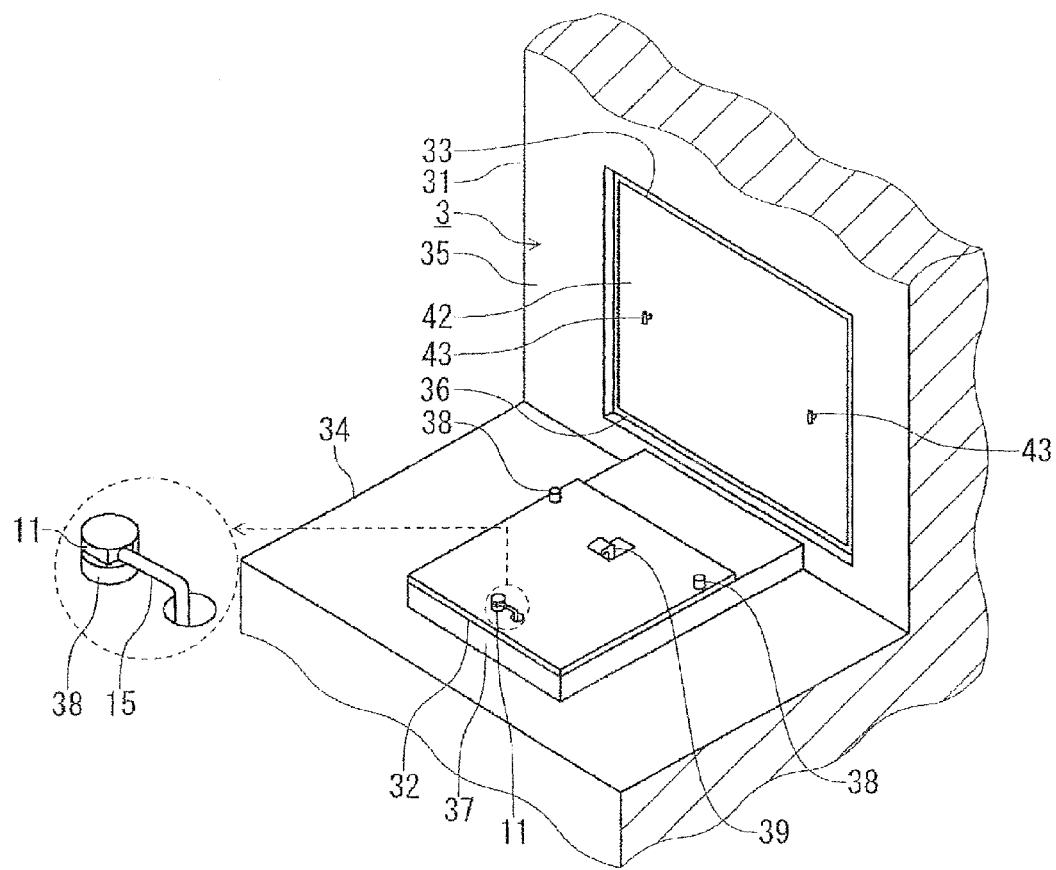
FIG. 3 is a perspective view of the carrier block.

In FIGS. 3 and 5, one of the three support pins 38 is circled by a dotted line, and the circled portion is separately depicted in an enlarged manner and as viewed in a different direction. As shown in the drawings, each support pin 38 has a side cutout portion in which a vibration sensor 11 is provided.

Any known vibration sensor may be used as the vibration sensor 11. For example, an instrument can be used which is used as a bone-conduction speaker or a bone-conduction microphone which converts a bone-conduction sound that propagates though a human skull and an electrical signal to each other. In FIG. 5, an enlarged and schematic vertical sectional side view of the vibration sensor 11 is shown in front of the chain-line arrow. Reference numeral 12 indicates a chassis, 13 indicates a support provided in the chassis 12, 14 indicates a circular piezoelectric element whose center portion is supported by the support 13 and which is composed of, for example, a piezoceramic material, and indicates a ring-shaped weight attached to the piezoelectric element 14 such that it surrounds the peripheral end of the piezoelectric element 14. The piezoelectric element 14 deforms in response to vibration of the vibration sensor 11, generating an electric charge. Not-shown internal wiring is provided in the chassis 12 in order to propagate an electrical signal (sensed signal) due to the electric charge to the outside of the chassis 12. In FIG. 3, reference numeral 15 indicates a cable, connected to the internal wiring, for sending the electrical signal to the control section 2. For clarity, the cable 15 is omitted from the drawings other than FIG. 3.

Layers 16, e.g. made of a resin, are formed on the external surface of the chassis 16 (FIG. 5). The layers 16 are in close contact with the support pin 38 and the chassis 12. On the other hand, the container body 5, when it is placed on the stage 32, comes into close contact with the support pin 38. Further, wafers W are in contact with the container body 5 when they are supported in the container body 5. Accordingly, when the sound of contact between a wafer W and a fork 48 is generated in the container body 5 as described below, a solid-borne sound of the contact sound, consisting of a longitudinal wave and a transverse wave which are transmitted through a solid as a medium, propagates in the order of the wafer W, the container body 5, the support pin 38, the layers 16, and the vibration sensor 11. The vibration sensor 11 vibrates by the solid-borne sound and outputs a signal in response to the vibration. Compared to an air-borne sound which is a longitudinal-wave vibration that propagates through air as a medium, a solid-borne sound is less subject to attenuation during propagation. Therefore, upon the occurrence of contact between a wafer W and the fork 48, the vibration sensor 11 can output with high accuracy a signal in response to the contact sound. Further, a solid-borne sound propagates faster than an air-borne sound. Thus, the sensor 11 can output the signal quickly after the generation of the contact sound.

The door 4 will now be described. The door 4 includes a door body 41 provided inside the chassis 31. The door body 41 is configured to be movable back and forth and also movable up and down by means of a not-shown drive mechanism so that it can open/close the transport opening 33 as shown in FIGS. 4 and 5. The door 4 also includes a lid opening/closing mechanism 42 located on the back of the door body 41. The lid opening/closing mechanism 42, on the back, has the above-described latch keys 43 which each rotate on a horizontal axis. When the stage 32 moves forward/backward, the latch keys 43 are inserted into/drawn from the key holes 63 of the lid 6 of the carrier C placed on the stage 32.

Figure 2:
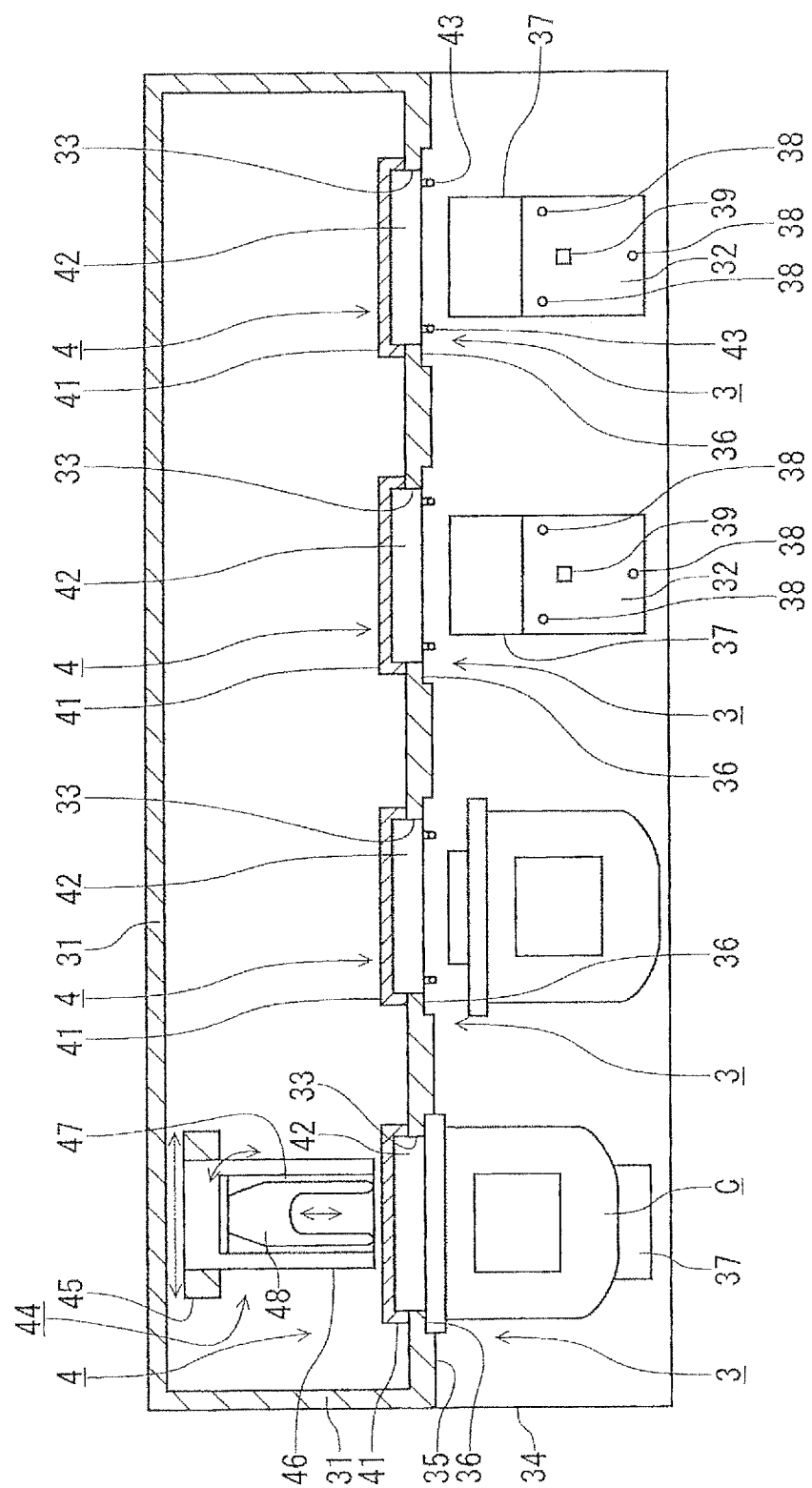
FIG. 2 is a plan view of the carrier block of the coating/developing apparatus.

As shown in FIGS. 2 and 4, a wafer transport robot 44, which is shared by all the loading ports 3, is provided in the chassis 31. The transport robot 44 includes an upright frame 45 movable laterally in a horizontal direction, a lifting stage 46 as a lifting mechanism liftably mounted to the frame 45, a base 47 rotatable on a vertical axis on the lifting stage 46, and a fork 48 which is movable back and forth on the base 47 and which functions as a support for a wafer W. The base 47 constitutes a back-and-forth movement mechanism for moving the fork 48 back and forth. The transport robot 44 can transfer a wafer W, through the open transport opening 33, between the slots 500 of the carrier C and the processing block E2. The components of the transport robot 44 are driven by not-shown motors.

Figure 7:
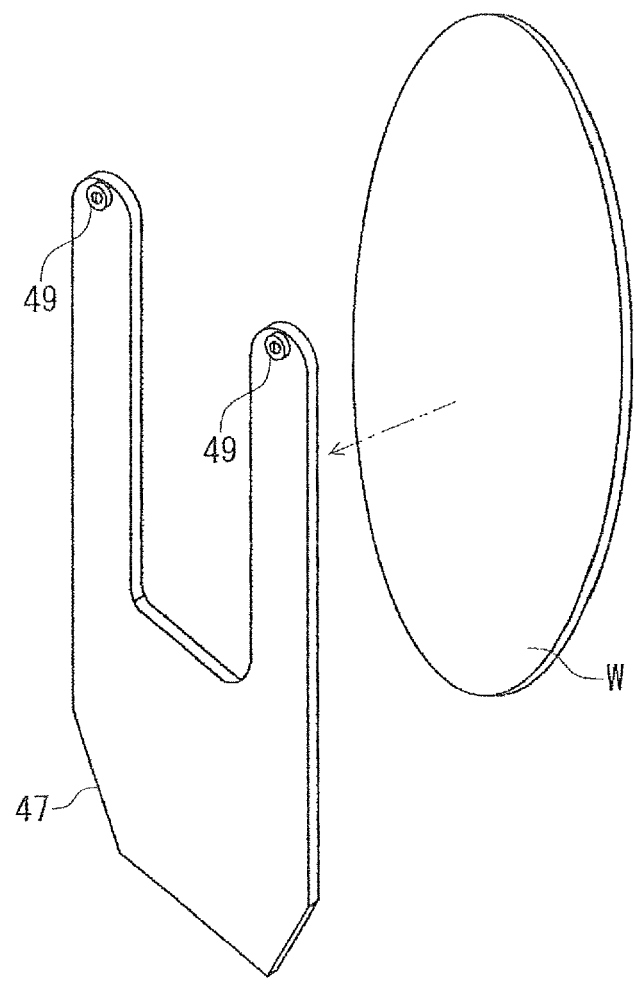
FIG. 7 is a perspective view of the back side of the fork of a transport robot provided in the carrier block.

The fork 48 is a flat plate, which is generally U-shaped in a plane view and whose branched portions extend parallel to each other, and is configured to transport a wafer W while supporting the back surface of the wafer W. The fork 48 is composed of, for example, a ceramic material. FIG. 7 is a perspective view of the back side of the fork 48. A pin 49, projecting from the back surface (lower surface) of the fork 48, is provided at the front end of each branched portion of the fork 48. The pins 49 are configured as a sound amplifying section for amplifying the sound of contact between the fork 48 and a wafer W in order to detect rubbing between the back surface of the fork 48 and the surface of the wafer W supported by the slots 500 of the container body 5.

Figure 8:
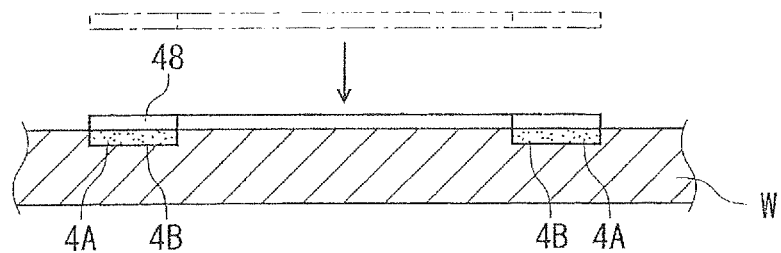
FIG. 8 is a front view of a fork and a vertical cross-sectional front view of a wafer W.
Figure 9:
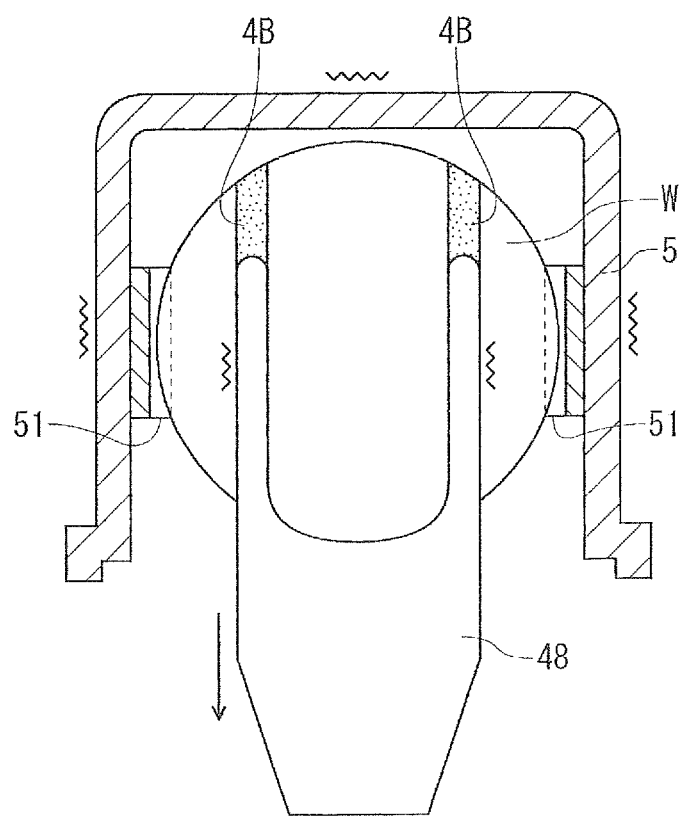
FIG. 9 is a plan view of the fork and the wafer.

In order to further illustrate the function of the pins 49, FIGS. 8 and 9 show a fork 48 which is not provided with the pins 49. FIG. 8 is a schematic view of a wafer W and the fork 48 as viewed in a direction from the front ends of the branched portions toward the base end. FIG. 9 is a top view of the fork 48 and the wafer W stored in the container body 5. The fork 48 moves into the container body 5 and transfers a wafer W to the slots 500, and subsequently moves downward and then moves backward. It is possible that upon the downward movement of the fork 48, the fork 48 can make contact with the surface of a below-located wafer W and move backward while keeping contact with the wafer W, thereby rubbing against the wafer W.

Since the back surface of the fork 48 and the surface of the wafer W are both flat surfaces, an air layer 4A is likely to exist between the back surface of the fork 48 and the surface of the wafer W upon the downward movement of the fork 48. Upon collision between the fork 48 and the surface of the wafer W, the air layer 4A acts as a cushion and damps the impact of the collision (FIG. 8). Thus, the air layer 4A decreases the solid-borne sound generated upon collision between the fork 48 and the wafer W. When the fork 48 then moves backward and rubs against the wafer W, the fork 48 moves as if sliding on the air layer 4A lying between the fork 48 and the surface of the wafer W. Thus, no large frictional force is generated between the fork 48 and the surface of the wafer W, and therefore a soft solid-borne sound is generated (FIG. 9). In the drawings, reference numeral 4B indicates scratches on the wafer W caused by rubbing.

Figure 10:
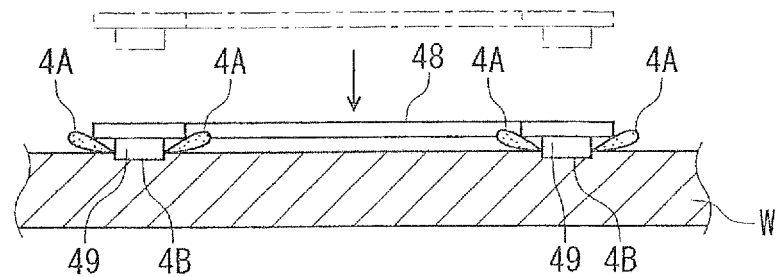
FIG. 10 is a front view of a fork and a vertical cross-sectional front view of a wafer W.
Figure 11:
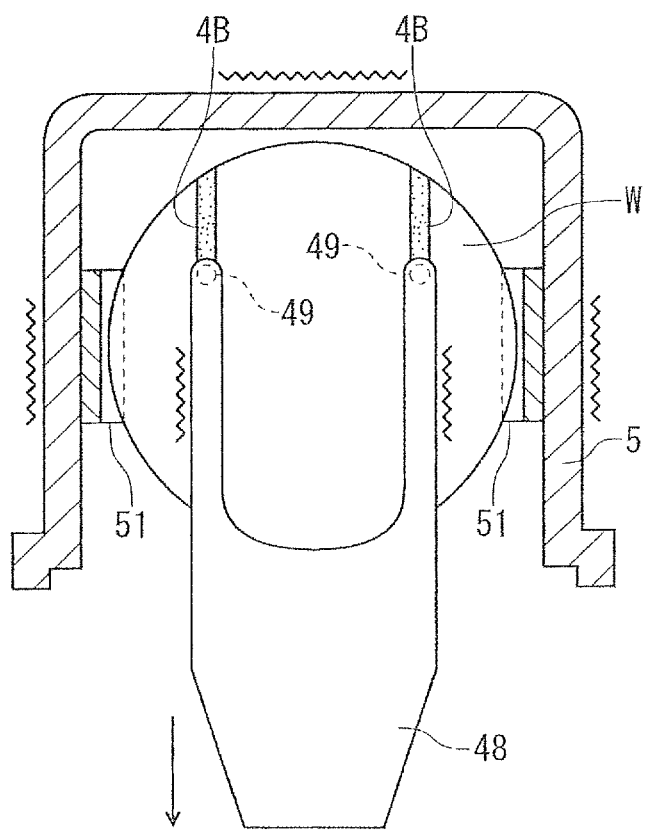
FIG. 11 is a plan view of the fork and the wafer.

FIGS. 10 and 11 show a fork 48 which is provided with the pins 49. FIG. 10, as with FIG. 8, shows a schematic view of a wafer W and the fork 48 as viewed in a direction from the front ends of the branched portions toward the base end. FIG. 11, as with FIG. 9, shows a top view of the fork 48 and the wafer W. When the fork 48 moves downward and collides with the surface of the wafer W, the fork 48 moves while breaking the air layer 4A with the pins 49 (FIG. 10).

Therefore, compared to the case where the pins 49 are not provided, damping by the air layer 4A of the impact of collision is reduced, and a louder solid-borne sound is generated by the collision. Further, the fork 48 moves backward while being less affected by the air layer 4A lying between the fork 48 and the surface of the wafer W. Thus, the slidability of the fork 48 on the air layer 4A is reduced, and the fork 48 rubs more against the surface of the wafer W, thereby generating a louder solid-borne sound (FIG. 11).

For the pins 49 is selected a material which, as described above, makes it possible to generate a louder solid-borne sound upon contact between the fork 48 and a wafer W as compared to the use of a fork 48 not having the pins 49, thereby increasing the intensity of the output signal from the vibration sensor 11. Examples of such a material include a metal and a relatively hard resin such as polyether ether ketone. A solid-borne sound, e.g. having a frequency of 500 Hz to 10000 Hz, will be generated upon the occurrence of contact between the fork 48 and a wafer W.

If the length L1 from the back surface of the fork 48 to the lower end of the pin 49 is too long, there is a high risk of contact with the surface of a wafer W; therefore, the pin 49 is designed to have such a length L1 as not to make the risk too high. For example, in the case where the distance between wafers W stored in adjacent pairs of slots 500 is about 10 mm, the length L1 may be about 100 μm. In the drawings such as FIGS. 4, 7, 10 and 13-17, the pins 49 are depicted such that the height (length L1) of the pins 49 relative to the thickness of the fork 48 is larger than the real height for convenience of illustration. Though the pin 49 is illustrated in the drawings as having a ring-like shape, the pin 49 is not limited to such a shape; for example, the pin 49 may have a disk-like shape, a rectangular shape, the shape of a vertically-extending rod, the shape of a laterally-extending rod, etc.

Figure 12:
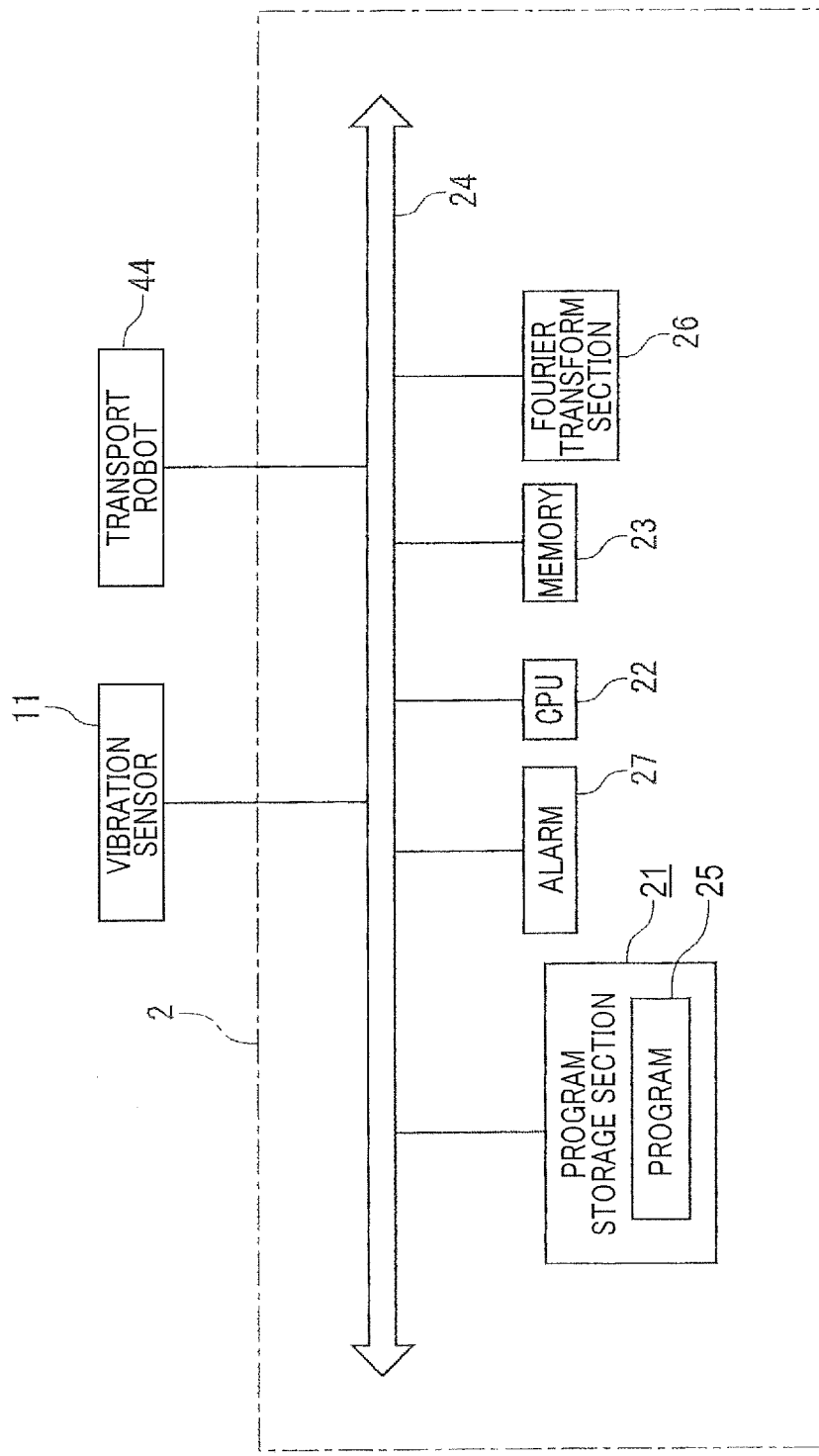
FIG. 12 is a block diagram of the control section of the coating/developing apparatus.

The control section 2, constituting a detection section and a correction mechanism, will now be described with reference to the block diagrams of FIG. 12. The control section 2 includes a program storage section 21, a CPU 22 and a memory 23, which are connected to a bus 24. The program storage section 21 is comprised of a computer storage medium such as a flexible disk, a compact disk, a hard disk, an MO (magneto optical disk), a memory card, or the like. A program 25 stored in such a storage medium is installed on the control section 2. The program 25 incorporates commands (steps) for the control section 2 to send control signals to components of the coating/developing apparatus 1 to control the operations of the components so that they can perform transport of a wafer W, operations on a wafer W in the blocks E1 to E4, transport of a wafer W out of the carrier C, transport of a wafer W into the carrier C, and the detection of rubbing between a wafer W and the fork 48. The CPU 22 performs various calculations to output such control signals.

The vibration sensors 11 provided in the support pins 38 of each stage 32 are connected to the control section 2. An output signal from each vibration sensor 11 is amplified by a not-shown amplifying section provided in the control section 2, and then converted from the analog signal to a digital signal by a converting section. The digital signal is outputted to the bus 24. In the memory 23 is stored time-series data (voltage data) on the voltage value of the output signal which is outputted from the vibration sensor 11 when the fork 48 moves forward/backward with respect to the container body 5 in order to set a wafer W in the container body 5.

A Fourier transform section 26 is connected to the bus 24. The Fourier transform section 26 performs a Fourier transform on the above voltage data to determine the below-described frequency spectrum. Further, an alarm output section 27 is connected to the bus 24. The alarm output section 27 outputs an alarm when it is determined that rubbing has occurred between a wafer W and the fork 48. A predetermined sound or display image may be used as the alarm.

A process for detecting rubbing between a wafer W and the fork 48 upon transfer of a wafer W to the carried C will now be described with reference to FIGS. 13 through 17 which illustrate the operation of the transport robot 44. First, while each vibration sensor 11 of the loading port 3 is outputting a signal to the control section 2, the carrier C is transported by the carrier transport mechanism to the stage 32 of the loading port 3. At this stage, writing of the voltage value of the signal from the vibration sensor 11 into the memory 23 is yet to be performed.

The support pins 38 of the stage 32 are inserted into the holes 56 of the carrier C in which transfer of wafers W is to be performed, whereby the carrier C is supported by the support pins 38 and placed on the stage 32, and is positioned at a backward position at a distance from the wall surface 35 of the loading port 3. Thereafter, the stage 32 moves forward, and the frame portion 54 of the carrier C enters the recessed portion 36 in the wall surface 35 and the latch keys 43 are inserted into the key holes 63 of the rotary portions 61. The latch keys 43 then rotate to release the engagement between the lid 6 and the container body 5, whereby the lid 6 is held by the lid opening/closing mechanism 42 of the door 4. Thereafter, the door body 41 moves forward and then moves downward, whereby the lid 6 is detached from the container body 5 and the transport opening 33 of the loading port 3 is opened.

Figure 13:
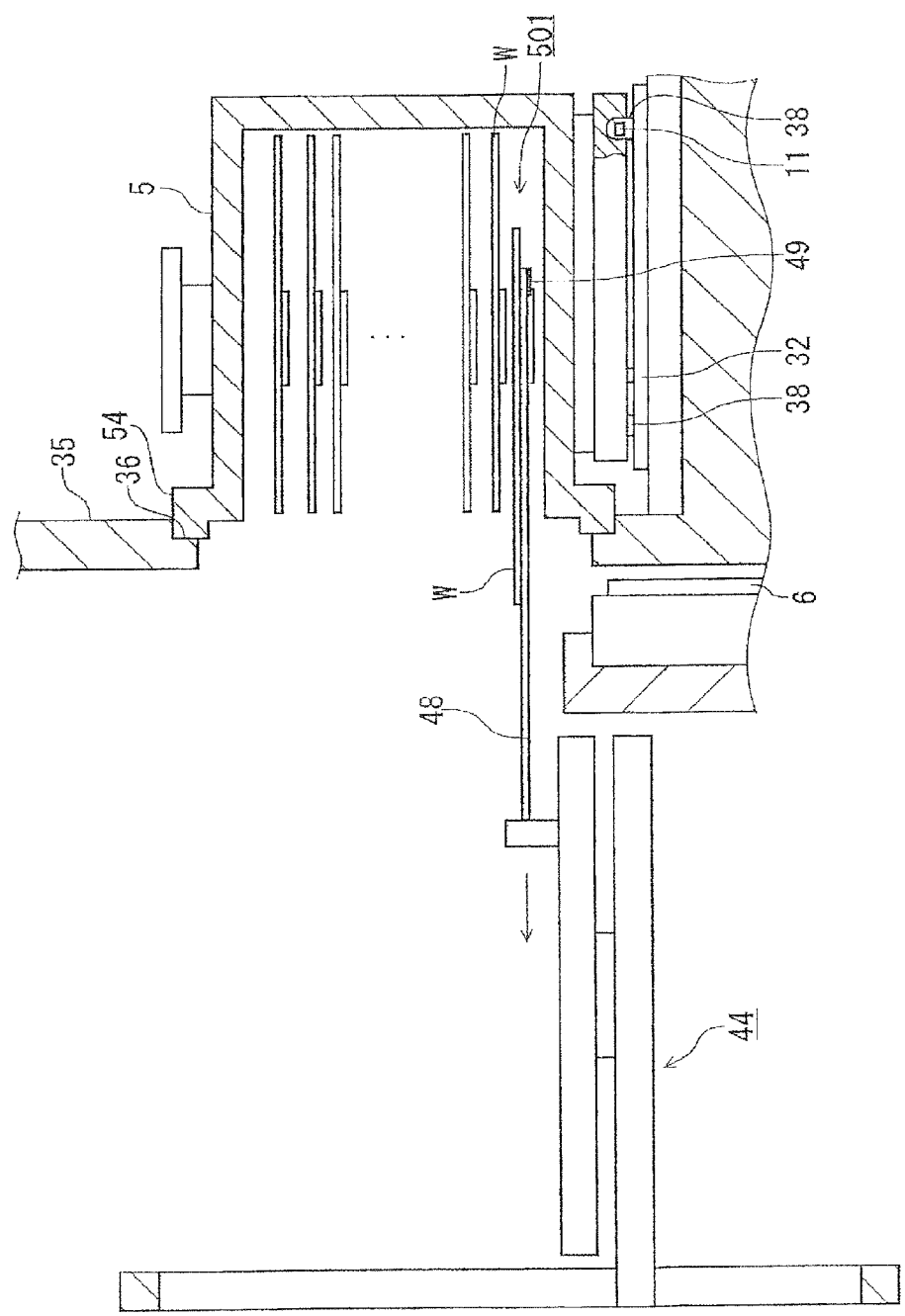
FIG. 13 is a diagram illustrating a process for transporting a wafer by the transport robot.
Figure 14:
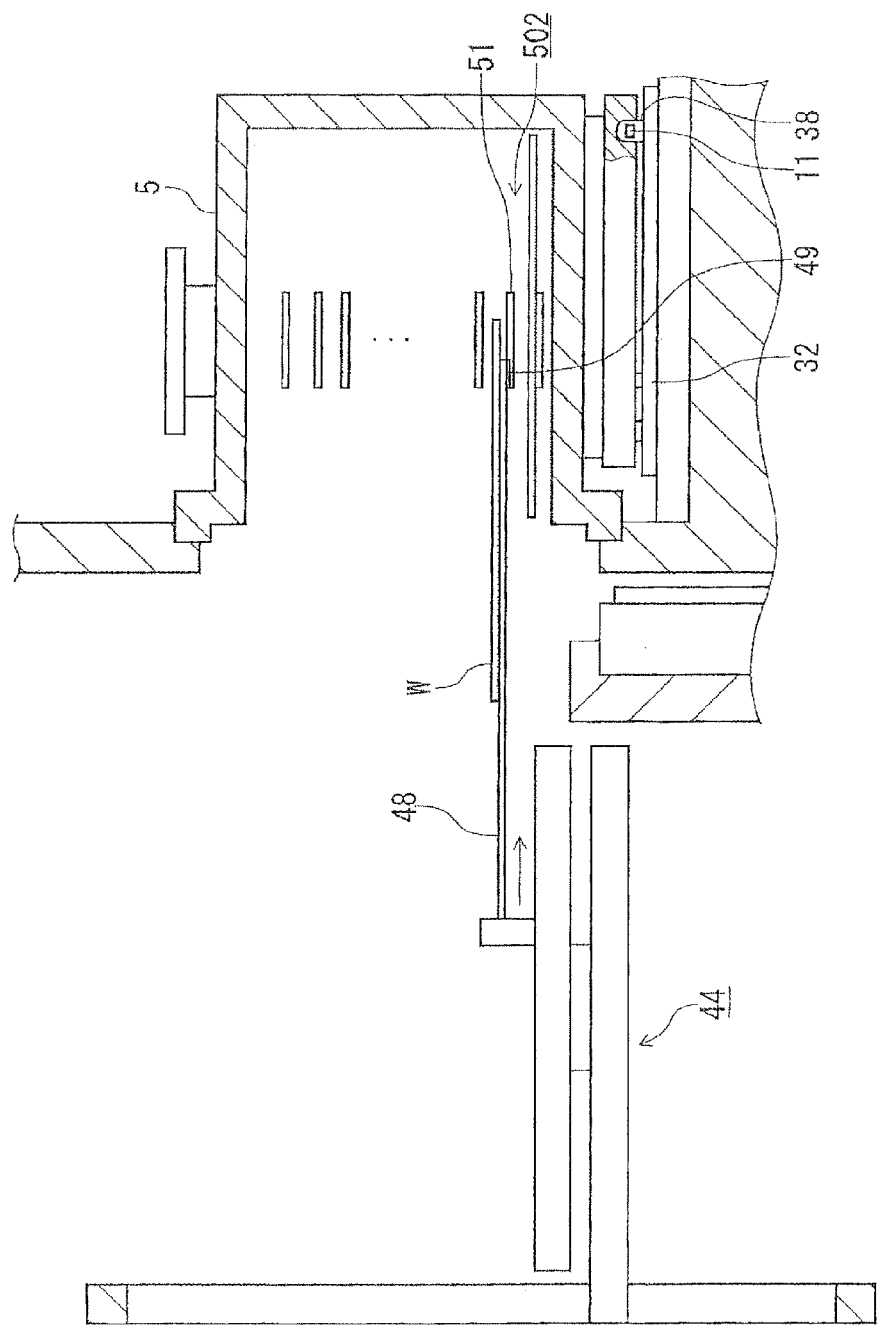
FIG. 14 is a diagram illustrating the process for transporting a wafer by the transport robot.

After the fork 48 of the transport robot 44 has reached a predetermined height position, the fork 48 moves forward to a position below a wafer W held by the slots 501 of the container body 5, and then moves upward to support the back surface of the wafer W. Thereafter, the fork 48 moves backward to transport the wafer W out of the container body 5 (FIG. 13). The wafer W is transported to the processing block E2. Thereafter, in the same manner as with the wafer W of the slots 501, the transport robot 44 sequentially transport wafers W from the slots 500 to the processing block E2 one by one in order from the lowest wafer W.

Figure 18:
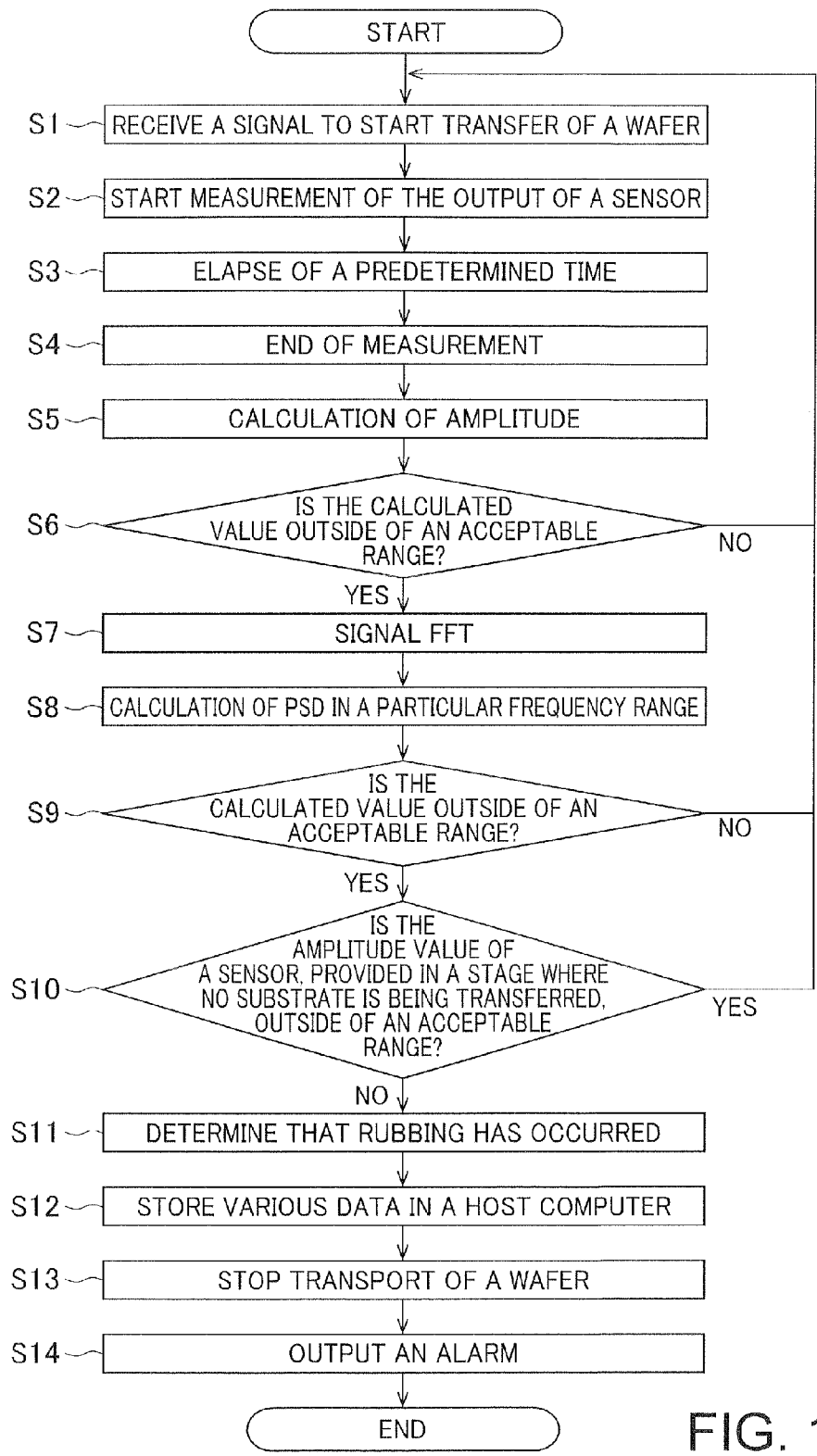
FIG. 18 is a flow chart showing the wafer transport process.

The wafer W which has been transported to the processing block 62 is transported in the order of: interface block E3→exposure apparatus E4→processing block E2. The wafer W is then returned to the same slots 500 in which the wafer W was originally stored. Thereafter, wafers W are sequentially retuned to the original slots 500 one by one in order from the lowest wafer W. The following description illustrates a case where after setting the wafer W of the slots 501 in the container body 5, the wafer W of the slots 502 and then the wafer W of the slots 503 are set in the container body 5. The description will be made with reference also to the flow chart of FIG. 18.

The fork 48, holding the back surface of the wafer W that has been transported out of the slots 502, moves to a preset height position. The fork 48 starts to move forward toward the container body 5 (FIG. 14) and, at the same time, an in-out signal, which indicates the start of the forward movement of the fork 48, i.e. the start of transfer of the wafer W by the fork 48, is outputted from the transport robot 44 to the control section 2. The control section 2 receives the in-out signal (step S1), and writing of the voltage data of the output signal from the vibration sensor 11 into the memory 23 is started (step S2).

Figure 15:
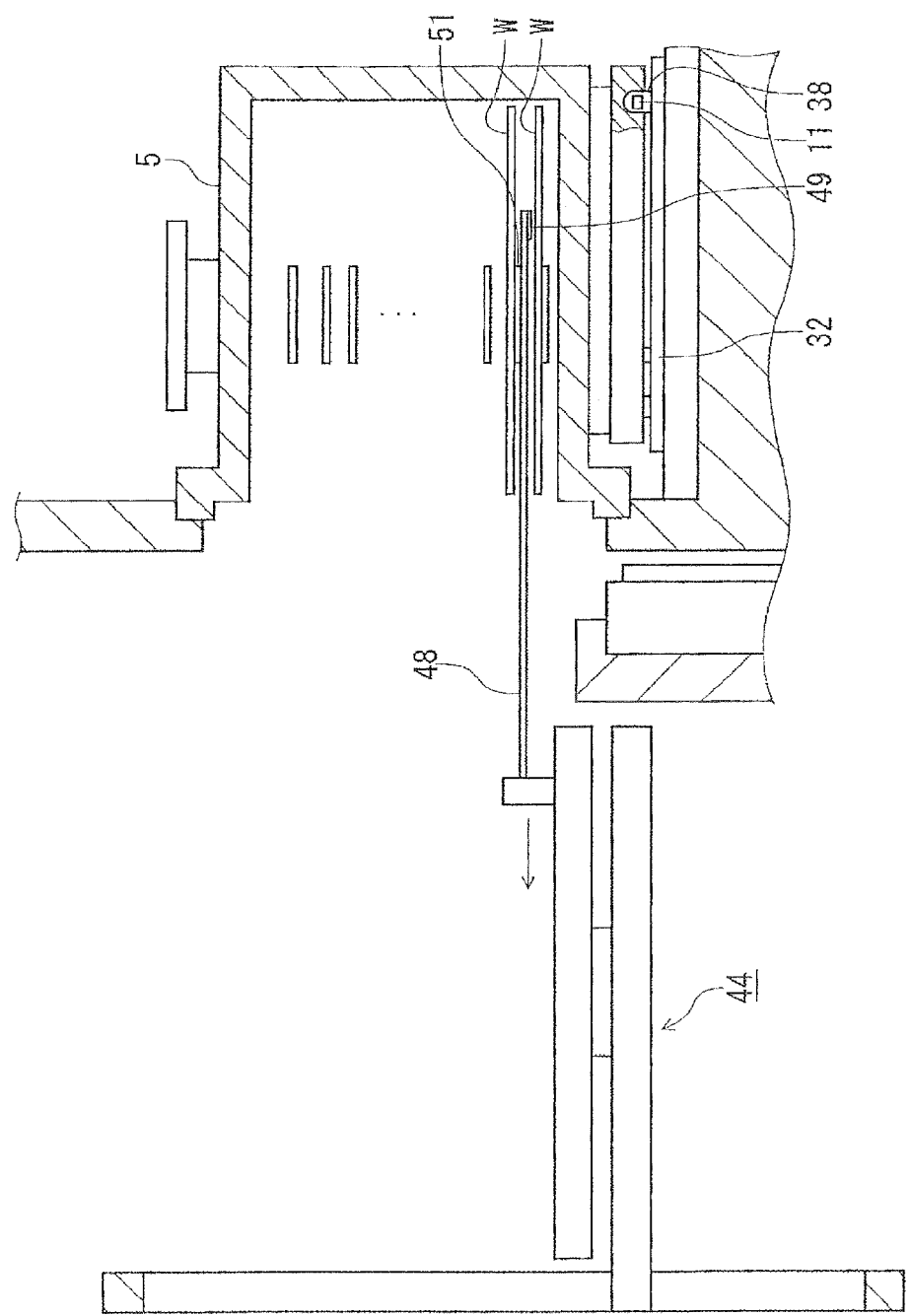
FIG. 15 is a diagram illustrating the process for transporting a wafer by the transport robot.
Figure 16:
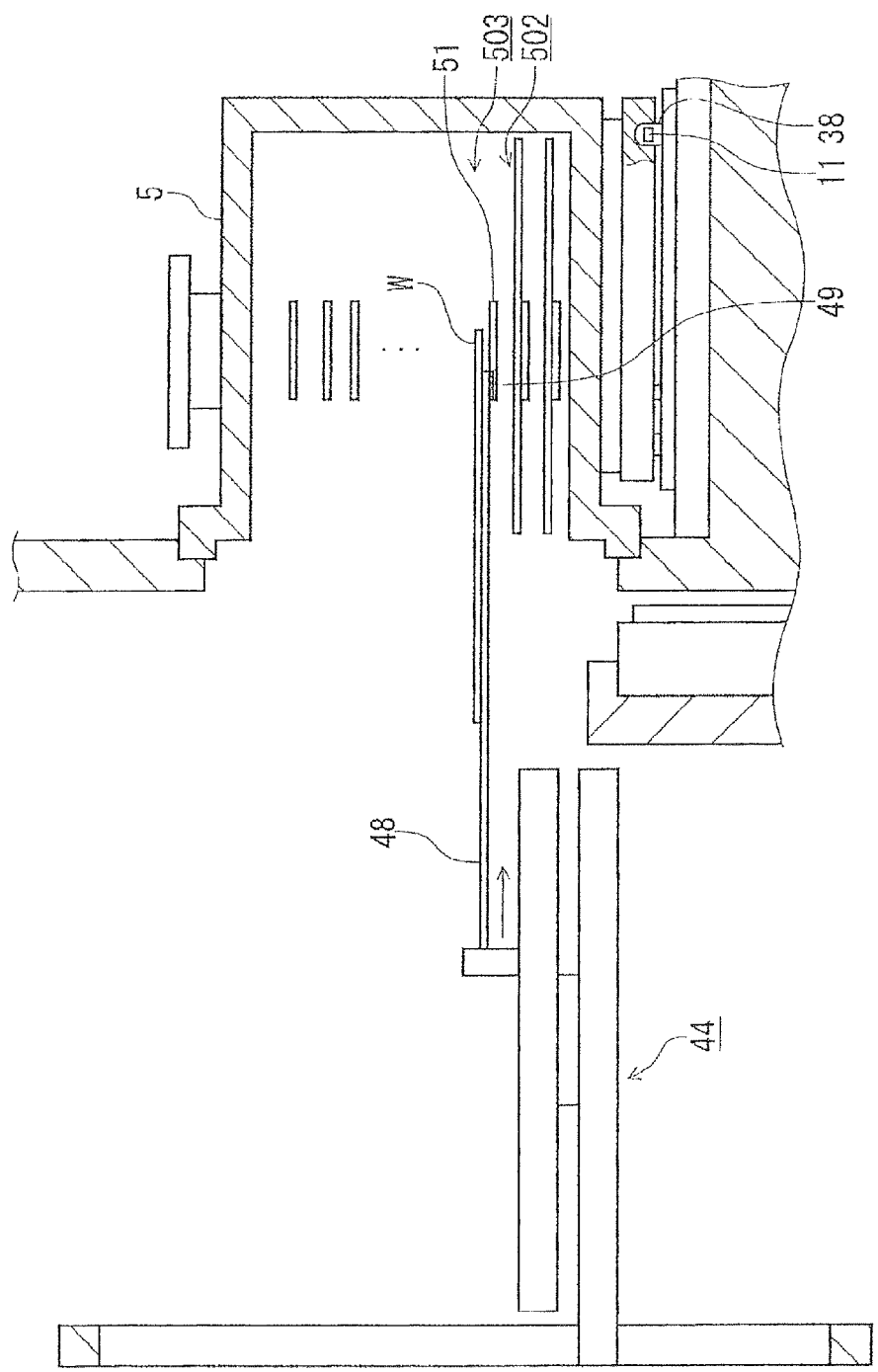
FIG. 16 is a diagram illustrating the process for transporting a wafer by the transport robot.

The fork 48 continues to move deeper into the container body 5, and stops at a predetermined position. The fork 48 then moves downward a predetermined distance and, after the back surface of the wafer W is transferred to the support portions 51 of the slots 502, moves backward (FIG. 15). The fork 48 exits the container body 5 and stops at a predetermined position. On the other hand, after a predetermined measurement time, e.g. 0.4 seconds, has elapsed from the start of storing of the voltage data (step S3), the writing of the voltage data is stopped (step S4). The timing for stopping the storing of the voltage data may be approximately or exactly the same as the timing for stopping the backward movement of the fork 48.

Figure 19:
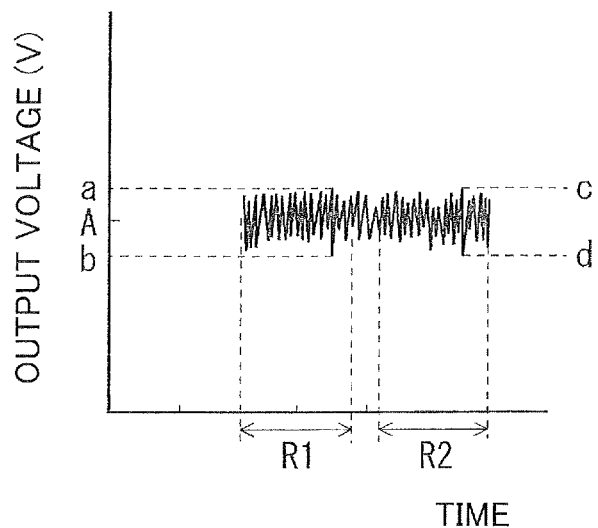
FIG. 19 is a graph showing an example of the output from the vibration sensor in the wafer transport process.

FIG. 19 is a graph showing an example of the voltage data stored in the memory 23 upon transport of the wafer W to the slots 502. In the graph, the abscissa indicates time and the ordinate indicates voltage. No rubbing between the fork 48 and the wafer W is assumed to occur upon transfer of the wafer W to the slots 502. The vibration sensor 11 vibrates e.g. due to vibration noise from a motor(s) of the transport robot 44; therefore, in the graph of FIG. 19, the voltage changes with time. The symbol "A" in the graph indicates a predetermined voltage value.

Upon the acquisition of the voltage data, the control section 2 detects the difference between the maximum value and the minimum value in a predetermined interval R1 (hereinafter referred to as "the earlier maximum amplitude"). The control section 2 also detects the difference between the maximum voltage value and the minimum voltage value in a predetermined interval R2 after the interval R1 (hereinafter referred to as "the later maximum amplitude"). The interval R1 is an interval in which the fork 48 moves forward in the container body 5. The interval R2 is an interval in which the fork 48 is moved downward and then moved backward in the container body 5. Thereafter, the control section 2 calculates the value "the later maximum amplitude−the earlier maximum amplitude" (step S5), and determines whether the calculated value falls within an acceptable range (step S6). In the exemplary data shown in FIG. 19, the earlier maximum amplitude is (a−b) and the later maximum amplitude is (c−d). As described above, contact between the fork 48 and the wafer W does not occur upon transfer of the wafer W to the slots 502. Therefore, the value "the later maximum amplitude−the earlier maximum amplitude=(c−d)−(a−b)" falls within the acceptable range.

When the value "the later maximum amplitude−the earlier maximum amplitude" thus falls within the acceptable range, then the fork 48 receives a wafer W from the block E2 and moves to a predetermined height position. Thereafter, in the same manner as the above-described transfer of the wafer W to the slots 502, the wafer W is transferred to the slots 503 while performing the steps S1 to S6.

In particular, the sequential operations of: the forward movement of the fork 48 holding the wafer W (FIG. 16); the start of acquisition of the voltage data; the stoppage of the forward movement of the fork 48; and the transfer of the wafer W to the support portions 51 of the slots 503 by the downward movement of a preset distance of the fork 48, are performed. Thereafter, the sequential operations of: the backward movement of the fork 48; the stoppage of the backward movement of the fork 48; the stoppage of acquisition of the voltage data; and a determination as to whether the value "the later maximum amplitude−the earlier maximum amplitude", calculated from the acquired voltage data, falls within the acceptable range, are performed.

When the fork 48 moves forward before transferring the wafer W to the slots 503, the fork 48 does not rub against a wafer W in the container body 5. However, as described above with reference to FIG. 10, it is possible that upon the downward movement of the fork 48, the back surface of the fork 48 can collide with the surface of the wafer W of the slots 502 (FIG. 17) and, when the fork 48 then moves backward, it can rub against the surface of the wafer W as shown in FIG. 11. As described previously, a solid-borne sound generated by the collision and rubbing propagates to the vibration sensor 11 via the container body 5, the stage 32 and the support pin 38, and an output signal in response to the solid-borne sound is outputted to the control section 2.

Figure 20:
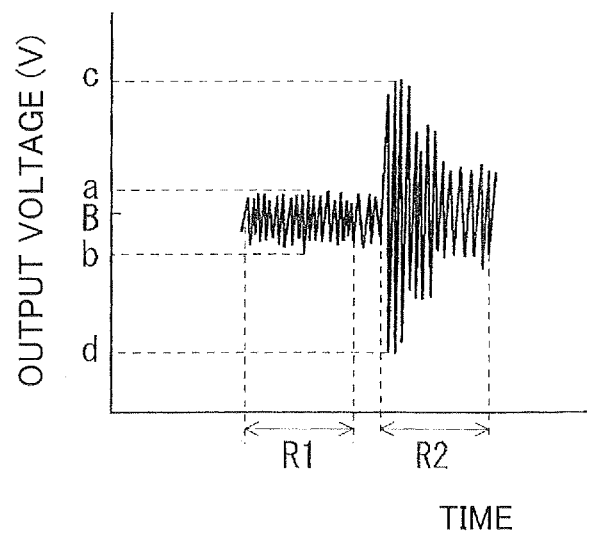
FIG. 20 is a graph showing an example of the output from the vibration sensor in the wafer transport process.

FIG. 20 is a graph which, as with FIG. 19, shows an example of the voltage data acquired upon transfer of the wafer W to the slots 503. Contact (collision and rubbing) occurs between the fork 48 and the wafer W of the slots 502 as described above, and a loud sound is generated especially by the collision of the pins 49 of the downwardly-moving fork with the wafer W. Accordingly, the later maximum amplitude (c−d) is larger than the earlier maximum amplitude (a−b). Thus, in the step S6 performed upon the transfer of the wafer W to the slots 503, it is determined that the value "the later maximum amplitude−the earlier maximum amplitude" falls outside of the acceptable range. The symbol "B" in the graph of FIG. 20 indicates a predetermined voltage value.

Figure 21:
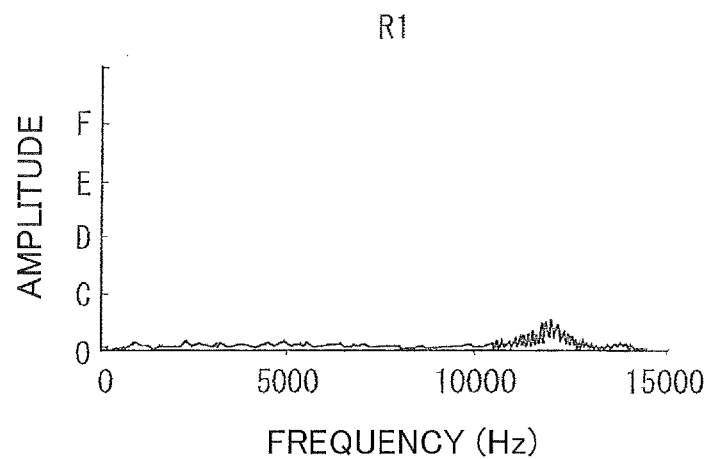
FIG. 21 is a graph showing exemplary frequency spectra obtained from the output from the vibration sensor.
Figure 21:
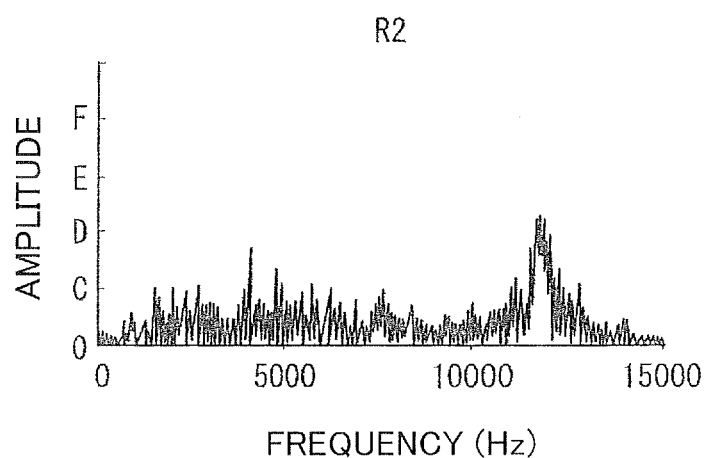

If it is determined in step S6 that the maximum amplitude difference falls outside of the acceptable range, then the control section 2 performs a Fourier transform on the voltage data, obtained upon the transfer of the wafer W to the slots 503, for the intervals R1 and R2 to determine the frequency spectrum (step S1). Referring to FIG. 21, the upper graph and the lower graph show an example of the frequency spectrum obtained from the voltage data of the interval R1 and an example of the frequency spectrum obtained from the voltage data of the interval R2, respectively. In the graphs, the abscissa indicates frequency and the ordinate indicates voltage amplitude.

The frequency spectrum obtained from the voltage data of the interval R1 is herein referred to as "the earlier frequency spectrum", and the frequency spectrum obtained from the voltage data of the interval R2 is herein referred to as "the later frequency spectrum". For the earlier frequency spectrum and the later frequency spectrum, the control section 2 calculates a power spectrum density (unit: $V^2/Hz$, hereinafter abbreviated as "PSD"), which is the amount of vibrational energy in a predetermined frequency range, for example, 500 Hz to 10000 Hz. The frequency range includes the frequency of the solid-borne sound generated by contact between the pins 49 and a wafer W as described above.

The PSD can be calculated by squaring the amplitude at each frequency in the above frequency range, and dividing the sum of the squared values by the value "the upper limit of the above frequency range−the lower limit of the above frequency range", i.e. "10000 Hz−500 Hz". The control section 2 calculates an earlier PSD from the earlier frequency spectrum and a later PSD from the later frequency spectrum, and then calculates the value "the later PSD−the earlier PSD" (step S8), and determines whether the calculated value falls within an acceptable range (step S9).

The determination in step S9 is thus made based on PSD for the following reason. The vibration sensor 11 can vibrate also due to causes other than rubbing between a wafer W and the fork 48. Such other causes may include vibration noise from a motor(s) that drives a component(s) of the transport robot 44, driving noise from a module which is processing a wafer W in the coating/developing apparatus 1, driving noise or an alarm sound from a semiconductor manufacturing apparatus other than the coating/developing apparatus 1, provided in the clean room, etc. Sounds or noises of such other causes have a higher frequency than the sound of contact between a wafer W and the fork 48.

Thus, when vibration of the vibration sensor 11 due to such other causes is detected, the amplitude in the frequency spectrum obtained is large in a frequency zone higher than 10000 Hz and small in a frequency zone lower than 10000 Hz. On the other hand, upon the occurrence of rubbing between a wafer W and the fork 48, the amplitude in the frequency spectrum obtained is large in a frequency zone lower than 10000 Hz and small in a frequency zone higher than 10000 Hz. Thus, the value "the later PSD−the earlier PSD" is relatively high when the sensor 11 vibrates upon the occurrence of contact between the fork 48 and a wafer W, whereas the value "the later PSD−the earlier PSD" is relatively low when the sensor 11 vibrates due to the above-described other causes. Therefore, the occurrence of contact between the fork 48 and a wafer W can be determined based on the value "the later PSD−the earlier PSD". In some cases, a signal similar to the sound of contact between a wafer W and the fork 48 can be detected due to environmental noise generated e.g. by opening/closing by a worker of a back door of the apparatus. In view of this, upon detection of a signal which makes the value "the later PSD−the earlier PSD" outside of an acceptable range, the control section 2 determines whether or not a similar signal has been detected at the same time also from some other stage 32 where transfer of a wafer W has not been performed (step S10). If a similar signal has been detected also by the vibration sensor 11 of some other stage 32 where transfer of a wafer W has not been performed, the signal is deemed as environmental noise, and it is determined that contact between the fork 48 and a wafer W has not actually occurred.

Figure 17:
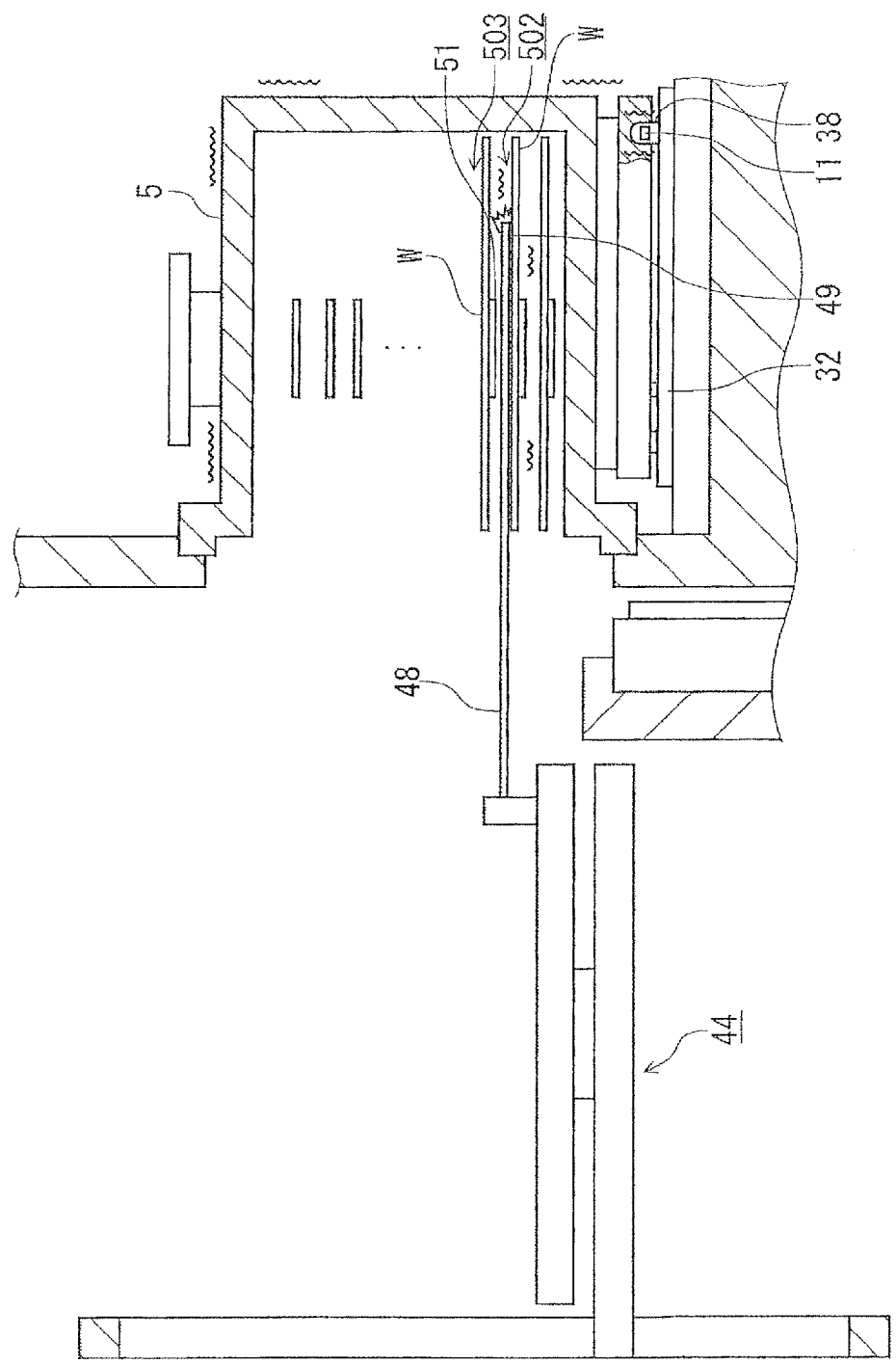
FIG. 17 is a diagram illustrating the process for transporting a wafer by the transport robot.

When contact between the fork 48 and a wafer W has occurred as shown in FIG. 17, the value "the later PSD−the earlier PSD" falls outside of the acceptable range in step S9. Further, it is confirmed in step 10 that a signal, which is similar to the signal that makes the value "the later PSD−the earlier PSD" outside of the acceptable range, has not been detected from any other stage 32 where transfer of a wafer W has not been performed. As a result, it is determined that rubbing of the fork 48 against the wafer W has occurred (step S11). Various data, including the time when the wafer W has been transferred to the slots 503 and the voltage data acquired upon transfer of the wafer W to the slots 503, are then sent to and stored in a host computer (step S12). Further, transport of a wafer W by the transport robot 44 is stopped (step S13), and an alarm is outputted (step S14).

While the process for detecting rubbing between a wafer W and the fork 48 upon transfer of a wafer W to the slots 503 has been described on the assumption that the rubbing has actually occurred, there is a case where the vibration sensor 11 vibrates due to cause other than the above-described other causes, and the difference between the earlier maximum amplitude and the later maximum amplitude falls outside of the acceptable range. In such a case, the value "the later PSD−the earlier PSD" is relatively low as described above and determined to be within the acceptable range in step S9. The process after step S9 is not performed; the next wafer W of the slots 504 is transferred to the container body 5 in the same manner as with the wafers W of the slots 502 and the slots 503.

As in the transfer of the wafers W to the slots 502 and the slots 503, the above-described steps S are performed in transferring wafers W to the slots 504 and the subsequent slots. If rubbing of a wafer W is not detected until transfer of all the wafers W to the slots 501—the slots 525 is completed, the transport opening 33 is closed by the door body 41 after transfer of a wafer W to the slots 525 and the lid 6 is attached to the container body 5. The stage 32 is moved to move the carrier C backward, and the carrier C is transported out of the stage 32 by the carrier transport mechanism. The next carrier C is transported to the stage 32.

While a description has been omitted for convenience, the operations of the steps S are performed also when transferring a wafer W to the lowermost slots 501. In this case, no wafer W exists below the fork 48 during the downward movement and the backward movement of the fork 48. Accordingly, instead of rubbing between the fork 48 and a wafer W, a determination is made on the occurrence of rubbing between the fork 48 and the interior wall of the container body 5.

According to the coating/developing apparatus 1, the pins 49 provided on the back surface of the fork 48 can generate a relatively loud contact sound upon collision of the downwardly-moving fork 48 with the surface of a wafer W and when the fork 48 then rubs against the surface of the wafer W, thereby making louder the solid-borne sound that propagates through the container body 5 of the carrier C. The vibration sensors 11 provided in the support pins 38 of each stage 32 detect the solid-borne sound and, based on the data acquired, the control section 2 determines whether or not rubbing between the fork 48 and a wafer W has occurred. The coating/developing apparatus 1 can thus detect the rubbing with high precision, making it possible to prevent a number of wafers W from being scratched.

The vibration sensor 11 detects the solid-borne sound that propagates through the container body 5; therefore, there is no need to provide the vibration sensor 11 in the transport robot 44. Compared to the case where an acoustic sensor or a vibration sensor is attached to the transport robot 44 to detect an abnormal collision between the transport robot 44 and a wafer W, the vibration sensor 11 is less likely to vibrate due to noise or vibration from a generation source such as a motor of the transport robot 44. Thus, the vibration sensor 11 is less likely to detect noise other than the sound of contact between the fork 48 and a wafer W. This can reduce erroneous detection of the noise as one generated by rubbing between the fork 48 and a wafer W.

Further, as described above, n the event of an abnormality in the difference value between the maximum amplitude of voltage in the interval R1 and the maximum amplitude of voltage in the interval R2, the control section 2 determines the occurrence of rubbing between the fork 48 and a wafer W based on the frequency spectrum data determined from the voltage data for the intervals R1 and R2. This can also prevent the above-described erroneous detection. Further, the control section 2 continually monitors signals from the vibration sensors 11 provided in all the stages 32. Therefore, if environmental noise, different from a sound due to rubbing between the fork 48 and a wafer W, has been generated for some reason, erroneous detection can be prevented by determining whether a signal, which is similar to a signal from the stage 32 where transfer of a wafer W has been performed, has been simultaneously detected from a stage 32 where no transfer of a wafer W has been performed.

Unlike the case where an acoustic sensor or a vibration sensor is attached to the transport robot 44 and the case where a distance sensor, comprised of a capacitive detection sensor, is attached to the fork 48 to detect the distance between the fork 48 and a wafer W, thereby detecting rubbing between them, the vibration sensor 11 in this embodiment is not provided in the transport robot 44.

Accordingly, wiring that connects the vibration sensor 11 and the control section 2 need not be a flexible one because the wiring does not need to bend in response to movement of the transport robot 44. Therefore, there is no fear of a decrease in the life of the wiring.

Based on the voltage data for the intervals R1 and R2, obtained during transfer of a wafer W to a pair of slots 500, the control section 2 calculates the value "the later maximum amplitude−the earlier maximum amplitude=(c−d)−(a−b)" to detect the occurrence of rubbing between the fork 48 and a wafer W lying under the fork 48. Even when noise is suddenly generated in the clean room, in which the coating/developing apparatus 1 is provided, due to the above-described various causes, the vibration sensor 11 vibrates in the intervals R1 and R2 due to the noise in the same manner. This can prevent erroneous detection.

Figure 22:
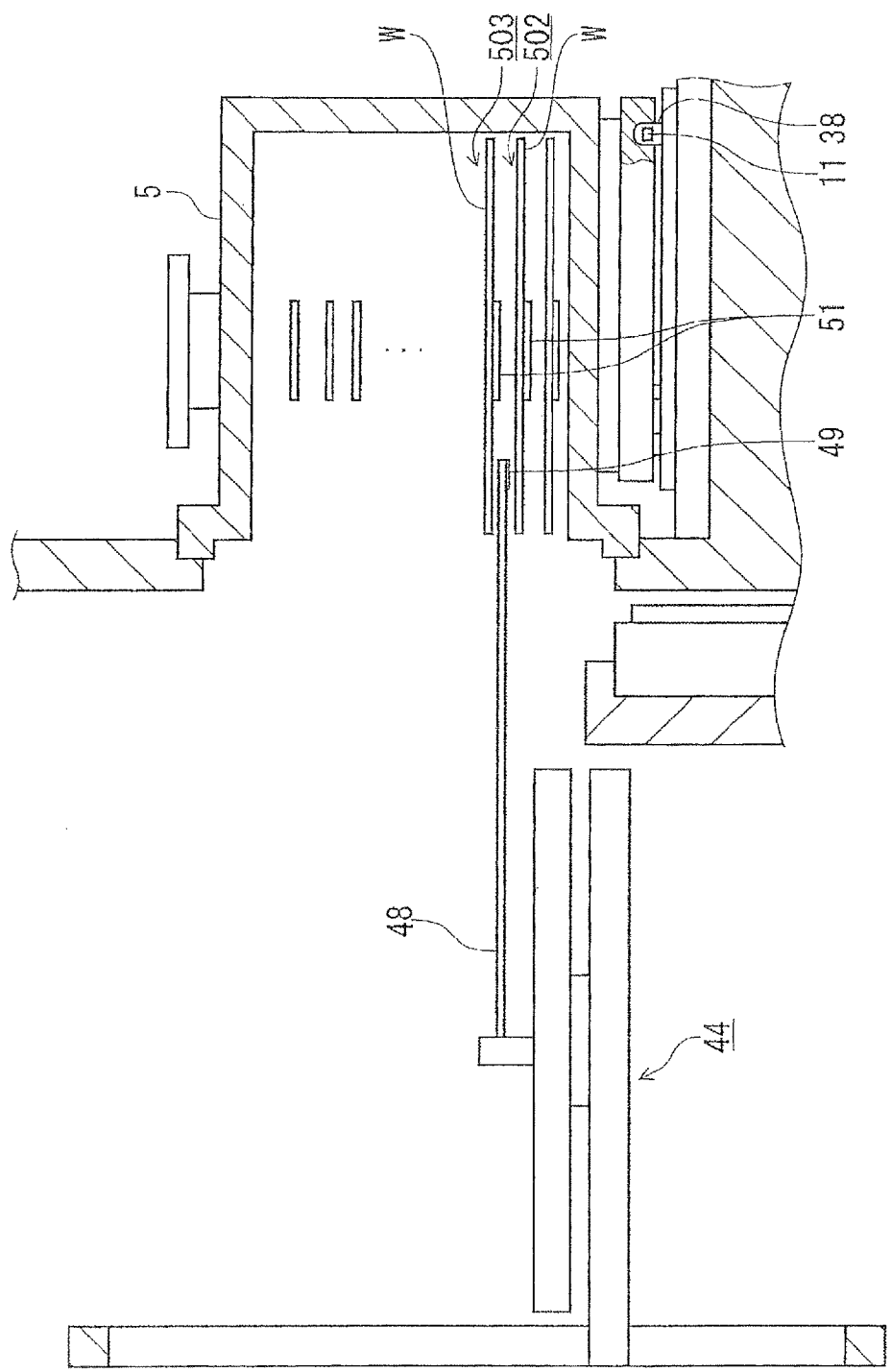
FIG. 22 is a diagram illustrating a process for adjusting the height of the transport robot.

Though in the above-described embodiment transport of a wafer W is stopped upon detection of rubbing between a wafer W and the fork 48, it is also possible not to stop transport of a wafer W: Assume that a decision has been made that rubbing between the fork 48 and a wafer W has occurred upon transfer of a wafer W to the slots 503. The fork 48 is positioned at a height position which is lower by a preset distance than a "slot-503 entry height position", which is a height position of the fork 48 at which the fork 48, holding a wafer W, moves forward when transferring the wafer W to the slots 503. Thereafter, the fork 48 moves forward a predetermined distance until the front ends reach a position between the wafers W of the slots 502, 503 (FIG. 22).

Figure 23:
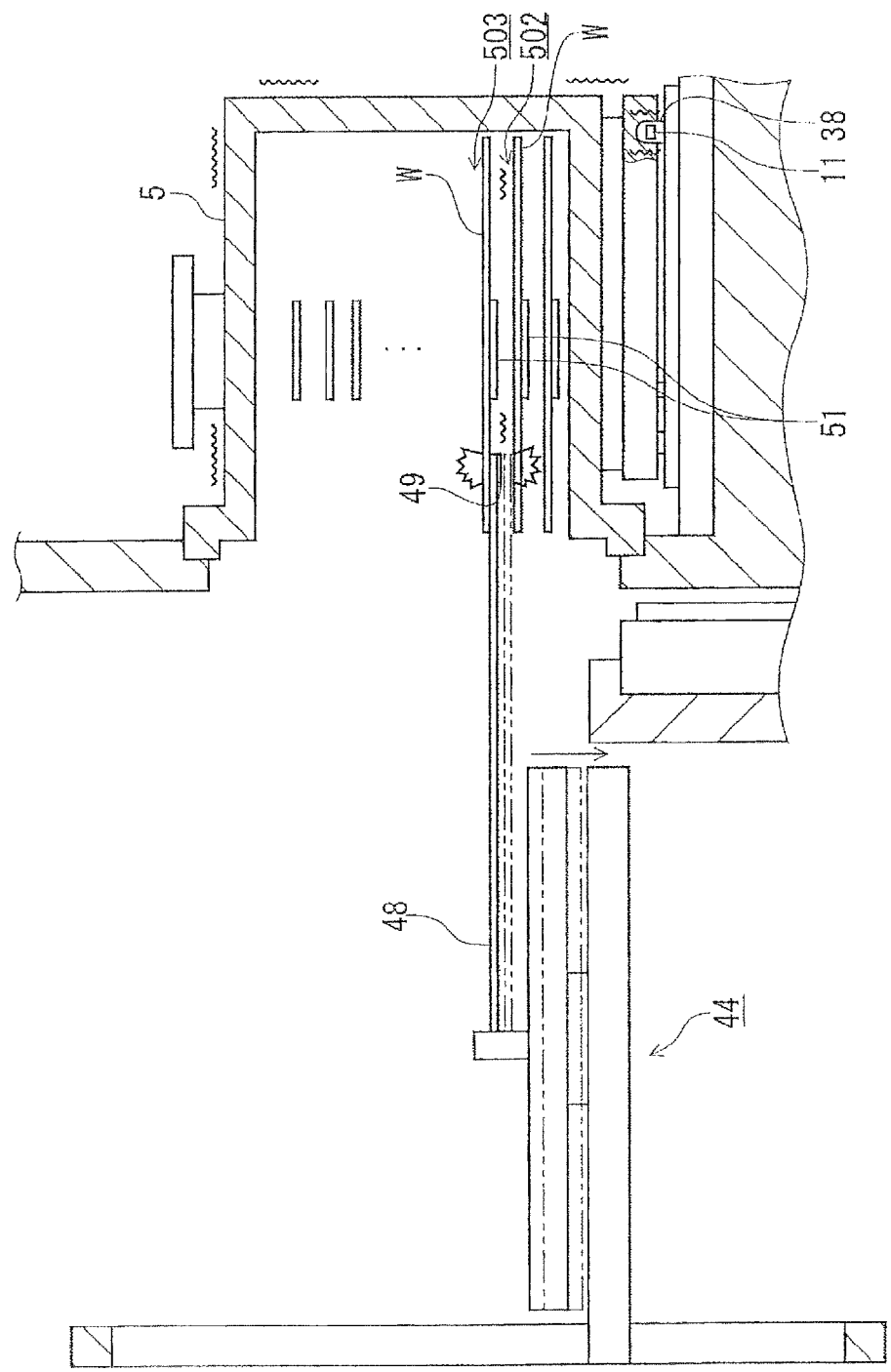
FIG. 23 is a diagram illustrating the process for adjusting the height of the transport robot.

The control section 2 monitors a change in the output signal from the vibration sensor 11 while moving the fork 48 upward. When the fork 48 collides with the back surface of the wafer W of the slots 503 and the voltage of the output signal rises, the control section 2 stores the height position of the fork 48 and stops the upward movement of the fork 48. Next, the control section 2 monitors a change in the output signal from the vibration sensor 11 while moving the fork 48 downward. When the fork 48 collides with the surface of the wafer W of the slots 502 and the voltage of the output signal rises, the control sect ion 2 stores the height position of the fork 48 and stops the downward movement of the fork 48 (FIG. 23). The control section 2 calculates e.g. an intermediate height position between the stored height positions, and determines the intermediate height position as a height position at which the fork 48 moves backward. The control section 2 then corrects the "slot-503 entry height position" by determining a height position, which is higher by a predetermined distance from the intermediate height position, as the corrected position.

After thus correcting the slot-503 entry height position, wafers W are sequentially transported to the slots 504 to 525 while performing the above steps S1 to S11. Thus, in this embodiment the stoppage of the movement of the transport robot 44 in step S12 is not performed even if rubbing between a wafer W and the fork 48 has been detected. After setting the wafers W in the slots 504 to 525, the carrier C is transported out of the stage 32, and a subsequent carrier C is transported to the stage 32. When, after sequentially carrying wafers W out of the subsequent carrier C, setting a wafer W in the slots 503, the fork 48 holding the wafer W is positioned and moves forward at the corrected slot-503 entry height position. Thereafter, the fork 48 moves backward at the above-described intermediate height position, whereby rubbing between the fork 48 and the wafer W of the slots 502 can be prevented.

According to this embodiment, adjustment of the height position of the fork 48 can be made automatically without resorting to human labor. The time for adjustment of the height position of the fork 48 can therefore be shortened. This can shorten the time from the detection of rubbing between the fork 48 and a wafer W to the restart of the operation of the coating/developing apparatus 1. Though in FIG. 23 the pins 49 are provided only on the back surface of the fork 48 as in the above-described embodiment, it is preferred to provide the pin(s) 49 also on the front surface of the fork 48 in order to accurately detect the height position of the fork 48 at which it makes contact with a wafer W.

Figure 24:
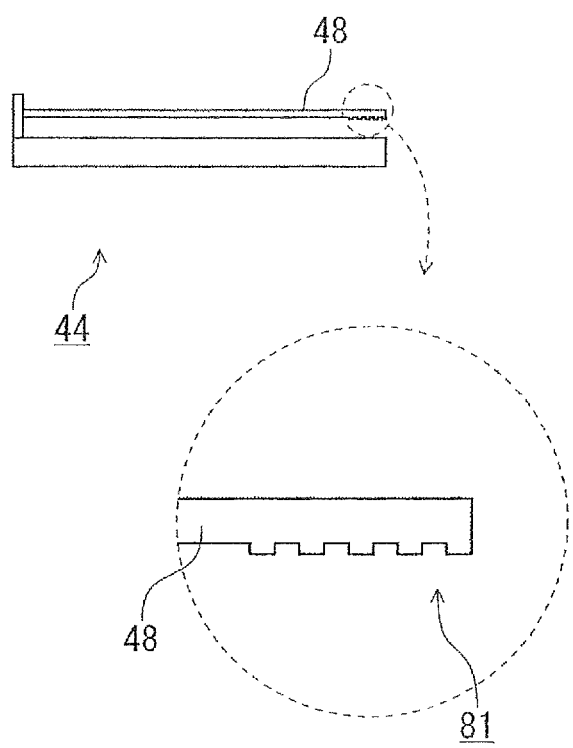
FIG. 24 is a side view showing another exemplary construction of the transport robot.
Figure 25:
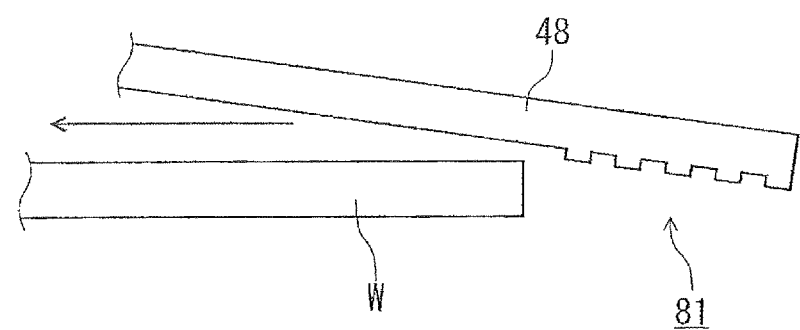
FIG. 25 is a side view showing the fork of the transport robot.
Figure 25:
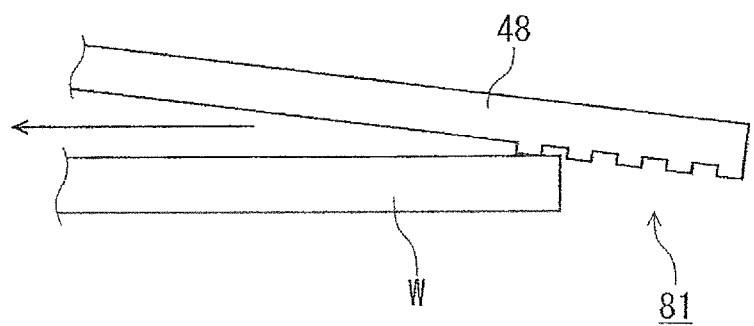

A method different from the use of the pins 49 may be used to increase the sound of contact between a wafer W and the fork 48. The front-end areas of the back surface of the fork 48 shown in FIG. 24 are configured as rough uneven portions 81 having fine surface irregularities. Though the fork 48 is provided in a horizontal position in the transport robot 44, the front ends are slightly inclined due to gravity. FIG. 25 illustrates rubbing of the inclined uneven front-end portions 81 of the fork 48 against an edge portion of a wafer W when the fork 48 moves backward. In FIG. 25, the inclination of the fork 48 is shown larger than the actual inclination.

When the uneven portions 81 rub against a wafer W, a larger energy is generated as compared to the case where a flat fork 48 rubs against the wafer W. Thus, the uneven portions 81 can generate a relatively louder rubbing sound. In order to distinguish between vibration of the vibration sensor 11 due to the above-described other causes and vibration of the vibration sensor 11 due to rubbing between the fork 48 and a wafer W, the uneven portions 81 may be configured to have such a surface roughness as to generate a solid-borne sound e.g. having the above-described frequency of 500 to 10000 Hz.

Figure 26:
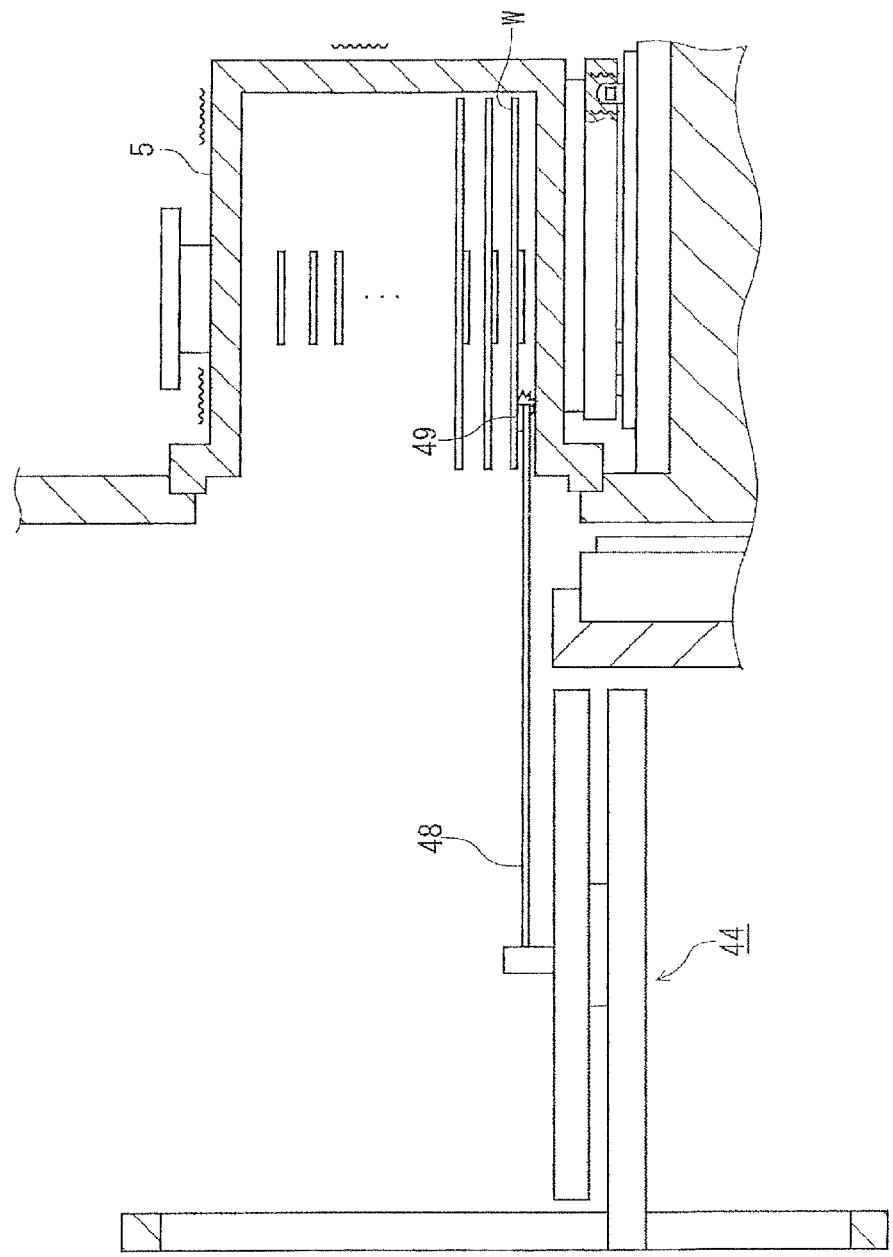
FIG. 26 is a side view showing yet another exemplary construction of the transport robot.

While the present invention has been described with reference to the detection of rubbing between the back surface of the fork 48 and the front surface of a wafer W, it is also possible to detect rubbing between the front surface of the fork 48 and the back surface of a wafer W. FIG. 26 shows an embodiment in which the pins 49 are provided on the front surface of the fork 48. If the pins 49, during the forward movement of the fork 48 before taking a wafer W from the container body 5, rub against the back surface of the wafer W, a solid-borne sound having a frequency of 500 to 10000 Hz is generated. It is also possible to provide the uneven portions 81, instead of the pin 49, in the front surface of the fork 48.

Figure 27:
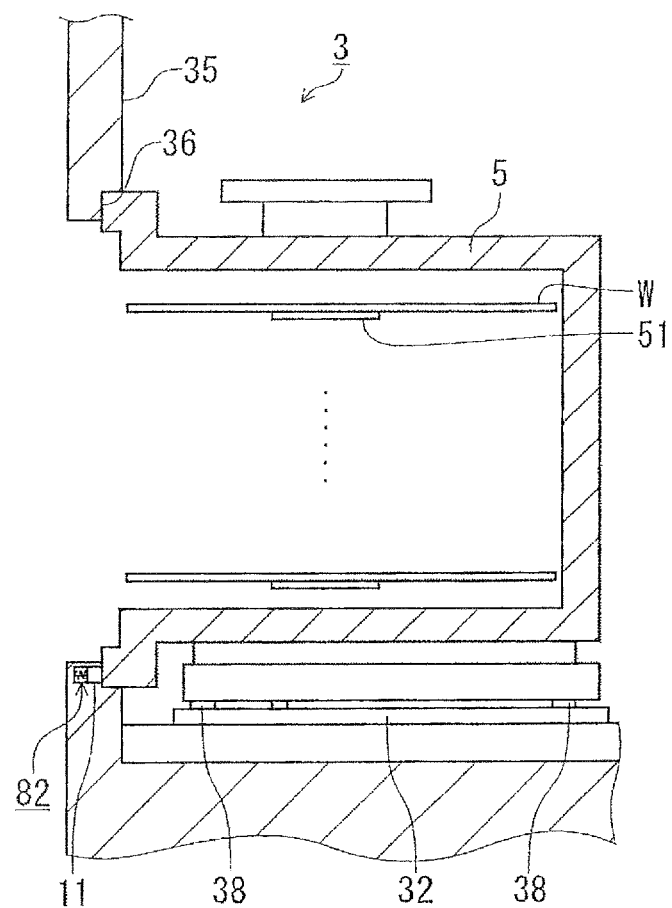
FIG. 27 is a vertical cross-sectional side view showing another exemplary construction of the loading port and the carrier of the carrier block.

The vibration sensor 11 need not necessarily be provided in the stage 32, provided that it can detect a solid-borne sound that propagates through the container body 5. FIG. 27 illustrates an embodiment in which the vibration sensor 11 is provided in the recessed portion 36 of the wall surface 35 of the loading port 3. In this embodiment a spring 82 as a biasing section is provided in front of the sensor 11. During transfer of wafers W to/from the container body 5, the vibration sensor 11 is biased backward by the spring 82 and is in close contact with the container body 5, whereby a solid-borne sound can be detected more securely. However, it is possible not to provide the spring 82 if, upon transfer of wafers W to/from the container body 5, the frame portion 54 of the container body 5 is moved to a position where it comes into close contact with the vibration senor 11.

Figure 28:
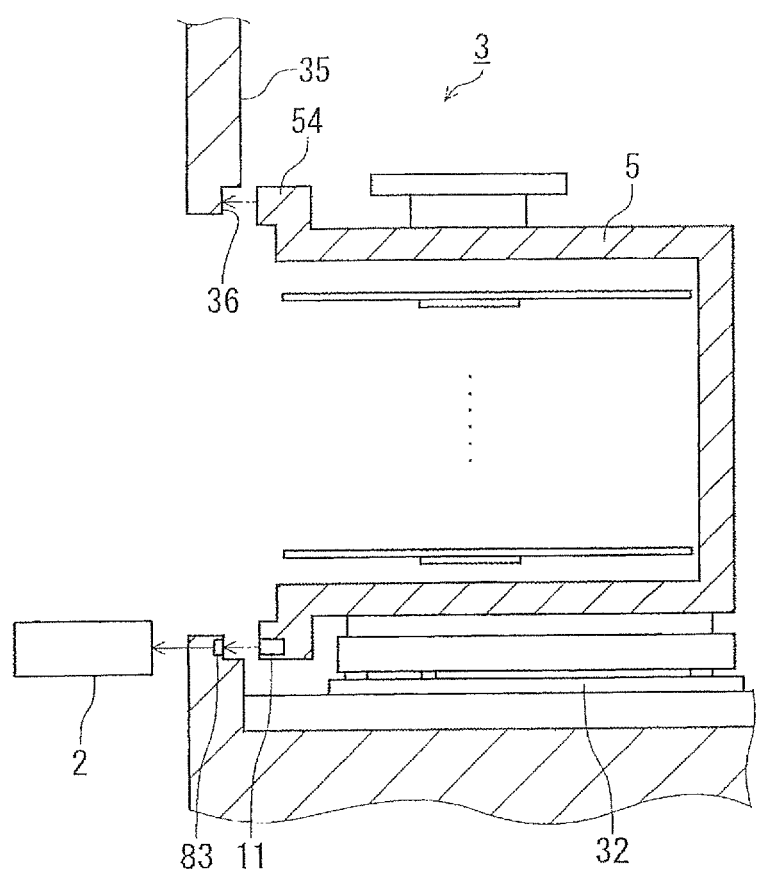
FIG. 28 is a vertical cross-sectional side view showing yet another exemplary construction of the loading port and the carrier of the carrier block.

It is also possible to provide the vibration sensor 11 in the container body 5 as shown in FIG. 28. In the container body 5, the sensor 11 is embedded in the frame portion 54, with the surface of the sensor 11 being exposed. An electrode (not shown) for extracting an output signal obtained from the piezoelectric element 14 is provided on the exposed surface of the sensor 11. An electrode 83 is embedded in the recessed portion 36 of the loading port 3. When the frame portion 54 enters the recessed portion 36 in order to transfer wafers W between the container body 5 and the transport robot 44, the electrode of the sensor 11 is connected to the electrode 83. The vibration sensor 11 is connected via the electrode 83 to the control section 2, so that an output signal from the vibration sensor 11 can be supplied to the control section 2.

Figure 29:
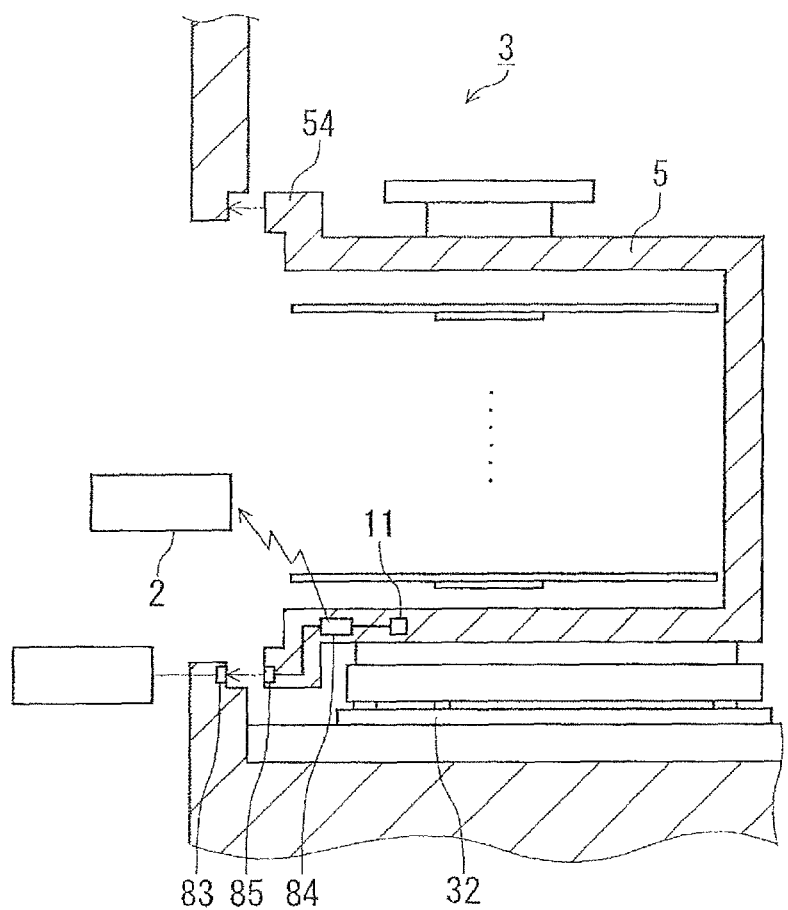
FIG. 29 is a vertical cross-sectional side view showing yet another exemplary construction of the loading port and the carrier of the carrier block.

FIG. 29 shows another exemplary construction of the container body 5 and the loading port 3. The vibration sensor 11 and a radio transmitting section 84 are embedded in the container body 5. The radio transmitting section 84 is connected to an electrode 85 exposed on the surface of the frame portion 54. Not the control section 2, but a power supply section 86, is connected to the electrode 83 embedded in the recessed portion 36. When the frame portion 54 of the container body 5 enters the recessed portion 36, the electrodes 83, 85 are connected to each other, and an electric power is supplied to the radio transmitting section 84. The radio transmitting section 84, to which an electric power is being supplied, converts an analog output from the vibration sensor 11 into digital data which can be radio-transmitted to the control section 2. Also in the above-described embodiments in which the vibration sensor 11 is disposed at a location different from the stage 32, an erroneous detection due to environmental noise can be prevented by continually monitoring all the vibration sensors 11 with the control section 2.

The present invention is not limited to detection of rubbing between the fork 48 and a wafer W in the container body 5. A vertical heat treatment apparatus is known which employs a holding tool, called a wafer boat, which holds a large number of wafers in a vertical shelf-like arrangement. Wafers W, together with the wafer boat holding the wafers, are carried into a heating furnace, where the wafers W are simultaneously heated. In the vertical heat treatment apparatus, a wafer W is transferred between the wafer boat placed on a stage and a carrier C by a transport robot like the transport robot 44. The above-described pins 49 or uneven portions 81 may be provided in the fork 48 of the transport robot, and the vibration sensor 11 may be provided e.g. in the stage such that a solid-borne sound is propagated from the wafer boat to the vibration sensor 11. Based on the output from the vibration sensor 11, the control section 2 can detect rubbing between the fork 48 and a wafer W held in the wafer boat.

Though in the above-described embodiment the lifting stage 46 is moved up and down upon transfer of a wafer W to/from the container body 5, it is possible to move the stage 32 up and down upon transfer of a wafer W. Also in that case, rubbing between a wafer W and the fork 48 can be detected. The phrase "transfer of a wafer W to/from the container body 5" includes at least one of the case of transferring a wafer W to the container body 5 and the case of transferring a wafer W from the container body 5. Thus, the apparatus may be configured to perform only one of transfer of a wafer W to the container body 5 and transfer of a wafer W from the container body 5.

(Evaluation Test)
Evaluation Test 1

An evaluation test which was conducted in connection with the present invention will now be described. In evaluation test 1, while repeatedly performing the operation of allowing the fork 48 of the above-described transport robot 44 to enter the container body 5 in which wafers W were stored, and subsequently moving the fork 48 downward and then moving the fork 48 backward, a voltage outputted from the vibration sensor 11, provided in the stage 32 as described above, was measured. After repeating the operation of the entry, the downward movement and the backward movement of the fork 48 a plurality of times, the same operation was repeatedly performed except for changing the height of the fork 48 upon its entry into the container body 5 and the height of the fork 48 upon the backward movement. As in the above-described embodiment, the pins 49, which are metal washers, were provided on the back surface of the fork 48.

In evaluation test 1-1, the height of the fork 48 was set so that during the backward movement of the fork 48, rubbing between the fork 48 and a wafer W in the container body 5 would not occur. In evaluation tests 1-1, 1-3 and 1-4, the height of the fork 48 was set so that during the backward movement of the fork 48, the fork 48 lay at a position lower by 33 μm, 66 μm and 99 μm than the surface of a wafer W stored in the container body 5, i.e. so that the fork 48 would rub against the wafer W. In all the evaluation tests 1-1 to 1-4, the height of the fork 48 was set so that rubbing between the fork 48 and a wafer W would not occur during the forward movement of the fork 48.

Figure 30:
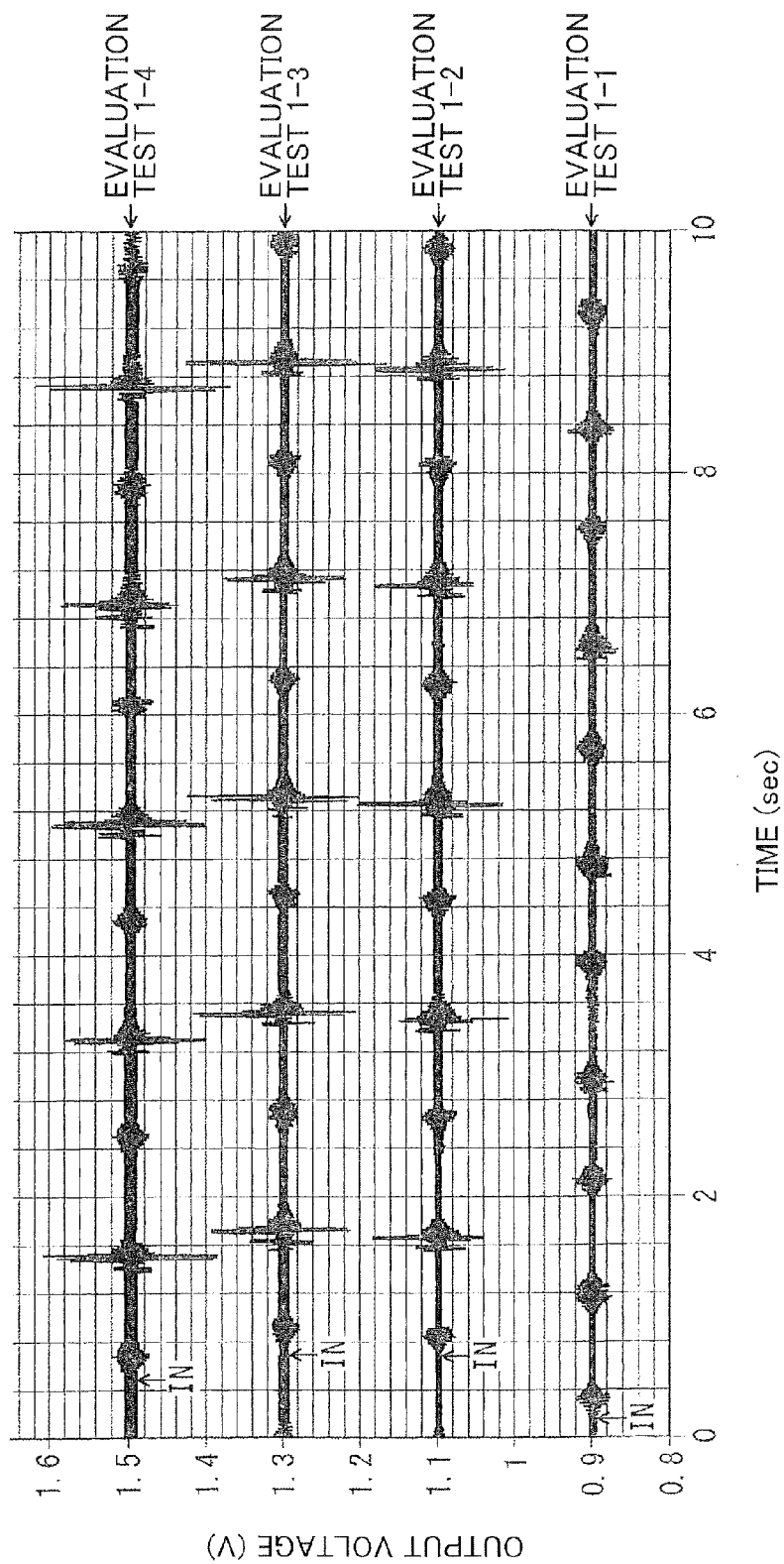
FIG. 30 is a graphical diagram showing the results of an evaluation test.

FIG. 30 is a graph showing the results of evaluation tests 1-1 to 1-4. In the graph, the abscissa indicates the time elapsed (unit: sec) since the start of each evaluation test, and the ordinate indicates the output voltage (unit: V). The graph shows a change in the voltage during five repeated operations of the entry, the downward movement and the backward movement of the fork 48 in each evaluation test. The "IN" in the graph indicates the time at which the first forward movement of the fork 48 was started. In evaluation test 1-1, a small change in the frequency occurred repeatedly. The changes in the frequency are due to operating noise from the transport robot 44 upon the entry, the downward movement and the backward movement of the fork 48. As can be seen from the data of evaluation test 1-1, the earlier maximum amplitude is approximately equal to the later maximum amplitude as described above.

In evaluation tests 1-2 to 1-4, after the occurrence of a small change in the frequency, a larger change in the frequency occurred; and this combination of the frequency changes repeated. The small frequency changes are due to the operating noise of the transport robot 44, while the large frequency changes are due to collision of the pins 49 of the downwardly-moving fork 48 with a wafer W and subsequent rubbing between the fork 48 and the wafer W. Thus, the later maximum amplitude is larger than the earlier maximum amplitude. As can be seen from the data of evaluation test 1, the occurrence of rubbing between the fork 48 and a wafer W can be determined based on the value "the later maximum amplitude–the earlier maximum amplitude" as described above.

Evaluation Test 2

The operation of moving the fork 48 forward and backward was performed repeatedly to sequentially set wafers W in the container body 5 while measuring a voltage outputted from the vibration sensor 11. In the evaluation test 2, the fork 48 was not provided with the pins 49. The height of the fork 48 was set so that rubbing between the fork 48 and a wafer W would occur during the wafer setting operation.

Figure 31:
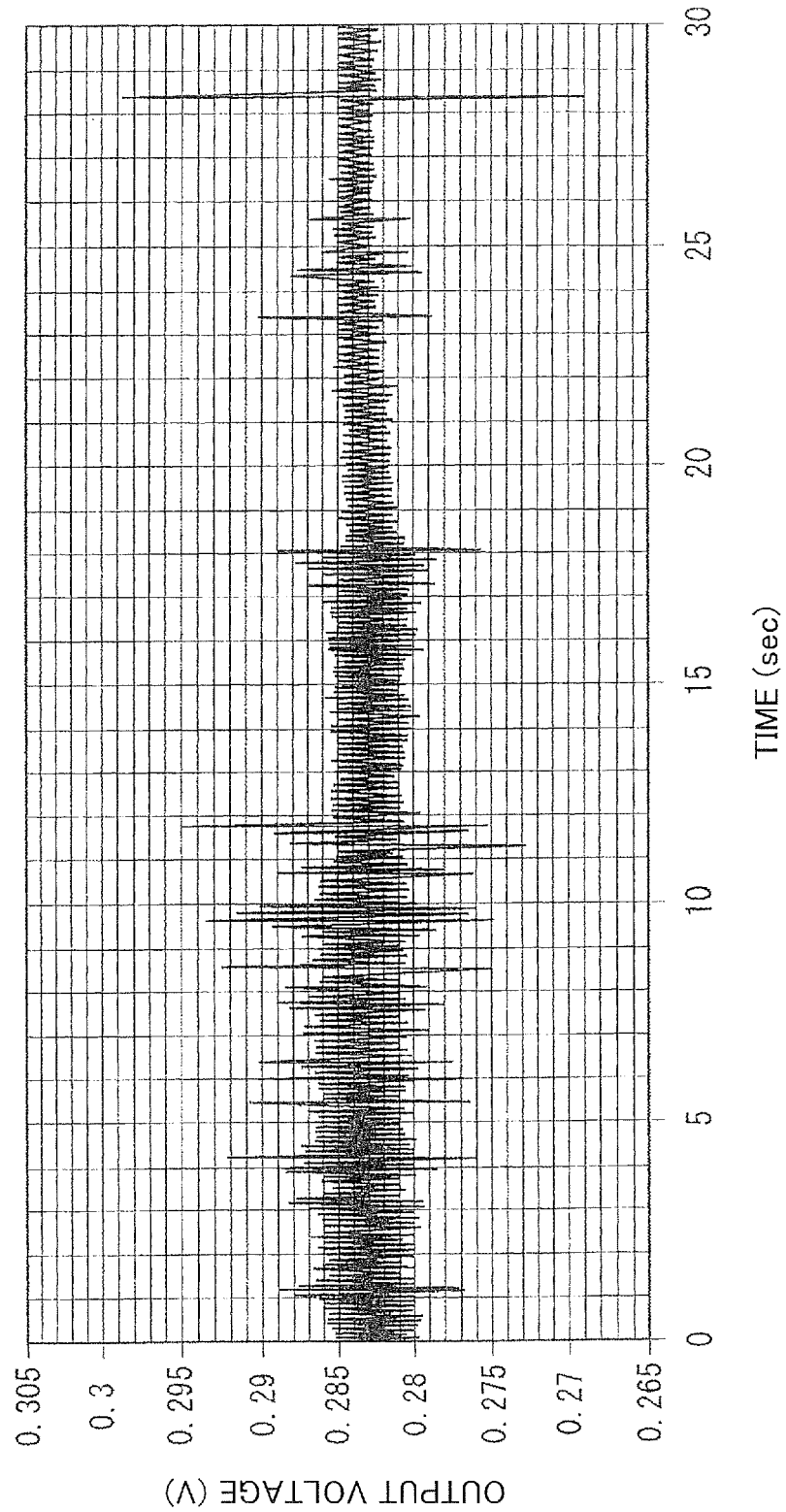
FIG. 31 is a graphical diagram showing the results of an evaluation test.

FIG. 31 is a graph showing the results of evaluation test 2. As with the graph of FIG. 30 for evaluation test 1, the abscissa and the ordinate of the graph of FIG. 31 indicate time and the output voltage, respectively. However, while 0.1-V scale lines and 20-mV auxiliary scales lines are drawn in the ordinate of the graph of FIG. 30, 5-mV scale lines and 1-mV auxiliary scales lines are drawn in the ordinate of the graph of FIG. 31. In evaluation test 2, the output voltage changes with a large width from the start to the end of measurement. This is considered to be due to the fact that the sensor 11 detected noises generated inside and/or outside the coating/developing apparatus 1, and that a detected vibration component coming from contact between a wafer W and the fork 48 is buried in the noise component. As will be appreciated from the results of evaluation test 2, the provision of the pins 49 or the uneven portions 81 in the fork 48 is effective in order to distinguish vibration caused by contact between a wafer W and the fork 48 from vibration caused by such other causes, thereby preventing erroneous detection of rubbing between the wafer W and the fork 48. It will also be appreciated that the above-described method which involves comparing the earlier maximum amplitude with the later maximum amplitude, and determining the occurrence of rubbing between a wafer W and the fork 48 based on the frequency spectrum is effective to prevent erroneous detection of the rubbing.

Evaluation Test 3-1

Figure 32:
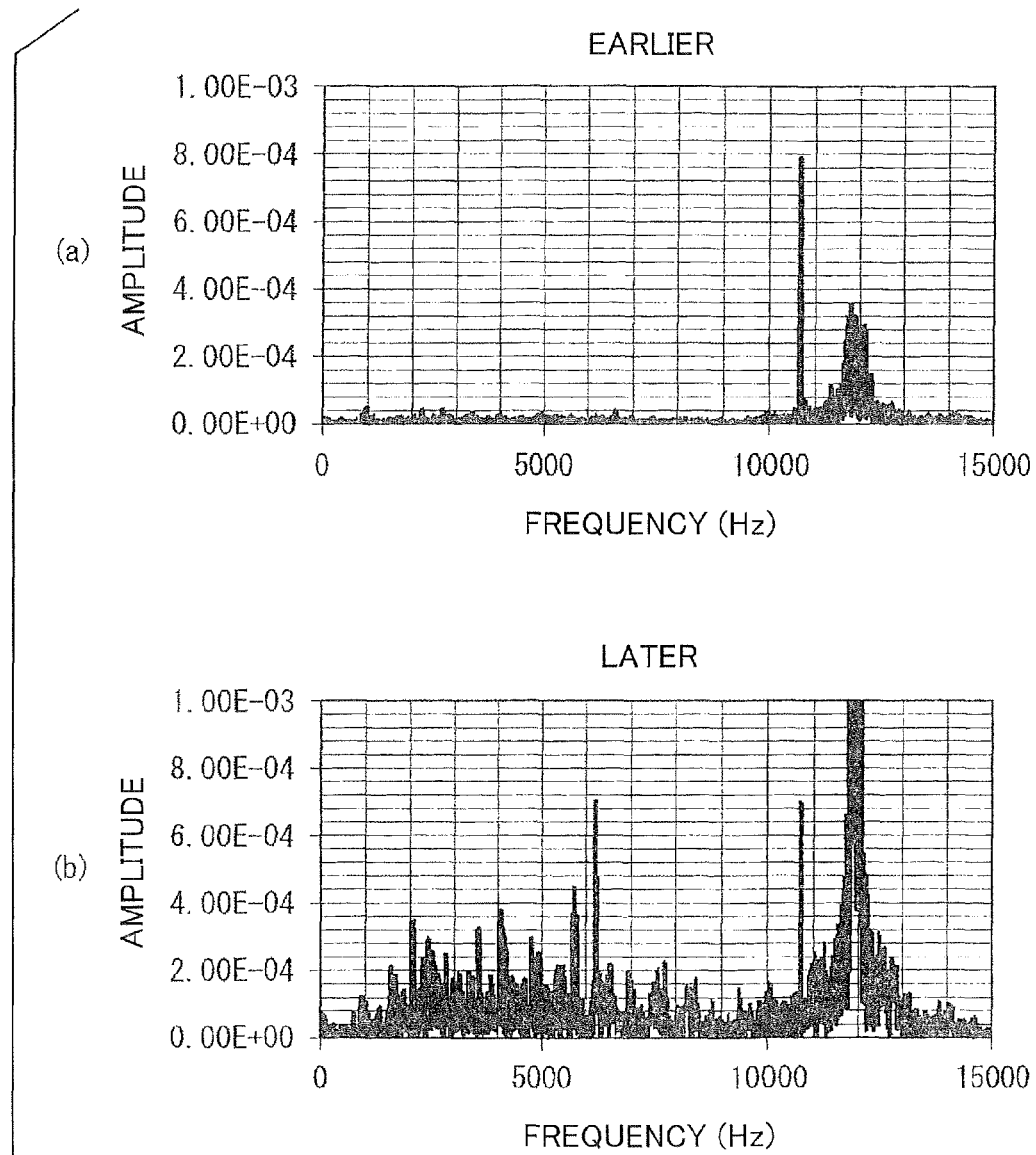
FIG. 32 is a graphical diagram showing the results of an evaluation test.

It is possible that when loud noise is generated in or around the coating/developing apparatus 1, the sound of contact between a wafer W and the fork 48 can be buried in the noise component even if the fork 48 has a sound amplifying section (protrusion). In view of this, intervals R1 and R2 were set for the voltage data acquired in the evaluation test 1-3, and the above-described earlier frequency spectrum and later frequency spectrum in the intervals R1 and R2 were determined. FIG. 32 shows the earlier frequency spectrum and the later frequency spectrum. As can be seen from comparison between the frequency spectra, there is a significant change in the amplitude in the frequency range of 500 Hz to 10000 Hz.

Thus, even when there is such loud surrounding noise that the sound of contact (interference) between the fork 48 and a wafer W is buried in the detected vibration noise, the occurrence of rubbing between the wafer W and the fork 48 can be detected by calculating the frequency spectrum and using the spectral intensity in a particular frequency range (500 to 10000 Hz in this test). The small difference between the earlier frequency spectrum and the later frequency spectrum in the frequency range over 10000 Hz in this test is considered to be due to the fact the high-frequency spectrum at a frequency of over 10000 Hz is mainly from a high-frequency noise, such as the driving noise of a surrounding structure, and little from the sound of contact between a wafer W and the fork 48.

Evaluation Test 3-2

Figure 33:
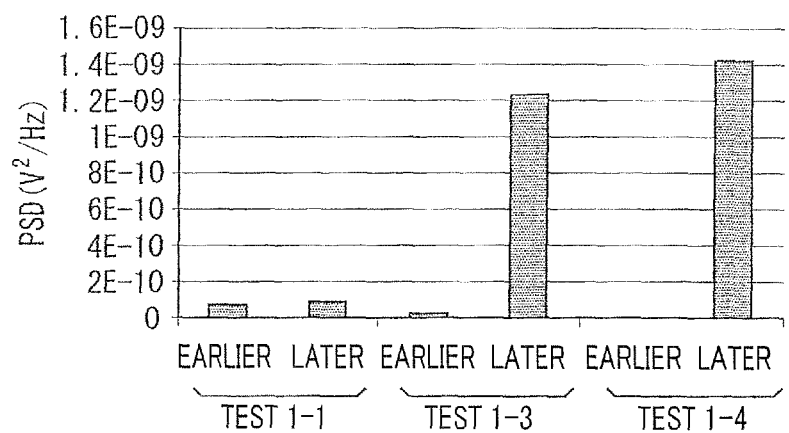
FIG. 33 is a graphical diagram showing the results of an evaluation test.
Figure 34:
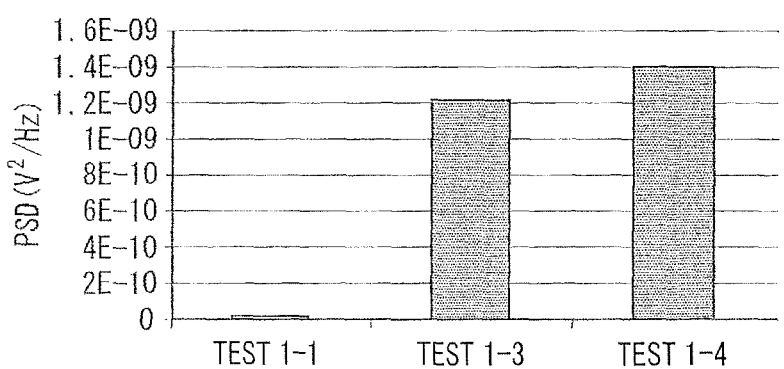
FIG. 34 is a graphical diagram showing the results of an evaluation test.

The above-described earlier PSD and later PSD were calculated from the voltage data acquired in the evaluation tests 1-1, 1-3 and 1-4. As with the above-described embodiment, the PSDs were calculated for the frequency range of 500 to 10000 Hz. Further, the value "the later PSD–the earlier PSD" was calculated. The graph of FIG. 33 shows the earlier PSD and the later PSD for each of the evaluation tests 1-1, 1-3 and 1-4, and the graph of FIG. 34 shows the value "the later PSD–the earlier PSD" for each of the evaluation tests. As can be seen in the data of FIG. 34, the value "the later PSD–the earlier PSD" is higher in the evaluation tests 1-3 and 1-4 than in the evaluation test 1-1. The results of the evaluation tests 3-1 and 3-2 demonstrate that the occurrence of rubbing between a wafer W and the fork 48 can be determined by using the frequency spectrum data.

DESCRIPTION OF THE REFERENCE NUMERALS

E1 carrier block
C carrier
W wafer
1 coating/developing apparatus
11 vibration sensor
2 control section
3 loading port
38 support pin
44 transport robot
48 fork
49 pin
5 container body
81 uneven portion

The invention claimed is:

1. A substrate transport apparatus comprising:
a stage for placing thereon a substrate holding tool for holding a number of substrates in a shelf-like arrangement;
a substrate transport mechanism including a support for supporting a lower surface of a substrate, and a back-and-forth movement mechanism for moving the support back and forth, said mechanism being configured to transfer a substrate to and from the substrate holding tool placed on the stage;
a lifting mechanism for moving the support up and down with respect to the substrate holding tool;
a sound amplifying section for amplifying a contact sound generated by contact between a substrate held in the substrate holding tool and the support, wherein the sound amplifying section is comprised of a protrusion for preventing a decrease in the contact sound due to an air layer existing between the substrate and the support; and
a detection section for detecting rubbing between a substrate and the support based on a detection signal from a vibration sensor which detects a solid-borne sound, propagating through the substrate holding tool, and outputs the detection signal.

2. The substrate transport apparatus according to claim 1, wherein the sound amplifying section is provided in the support.

3. The substrate transport apparatus according to claim 1, wherein the detection section detects rubbing between the substrate and the support based on a frequency spectrum obtained from the detection signal from the vibration sensor.

4. The substrate transport apparatus according to claim 1, wherein the vibration sensor is provided in the stage.

5. The substrate transport apparatus according to claim 1, further comprising a partition wall having a transport opening for transferring a substrate between the substrate holding tool and the substrate transport mechanism, wherein the vibration sensor is provided in the partition wall.

6. The substrate transport apparatus according to claim 5, wherein a biasing section for biasing the vibration sensor toward the substrate holding tool placed on the stage is provided in the partition wall.

7. The substrate transport apparatus according to claim 1, comprising a plurality of stages and a plurality of vibration sensors corresponding to the stages, wherein when detection signals are outputted simultaneously from a vibration sensor corresponding to a stage where a substrate is being transported and from a vibration sensor corresponding to at least one stage where no substrate is being transported, the detection section determines that rubbing between a substrate and the support has not occurred.

8. The substrate transport apparatus according to claim 1, wherein when rubbing between a substrate and the support has been detected by the detection section, the detection section controls the operation of the lifting mechanism so as to correct a height of the support during transfer of a substrate to and from the substrate holding tool.

9. A substrate transport apparatus comprising:
a stage for placing thereon a substrate holding tool for holding a number of substrates in a shelf-like arrangement;
a substrate transport mechanism including a support for supporting a lower surface of a substrate, and a back-and-forth movement mechanism for moving the support back and forth said mechanism being configured to transfer a substrate to and from the substrate holding tool placed on the stage;
a lifting mechanism for moving the support up and down with respect to the substrate holding tool;
a sound amplifying section for amplifying a contact sound generated by contact between a substrate held in the substrate holding tool and the support, wherein the sound amplifying section is comprised of an uneven portion for amplifying the contact sound generated by contact between the substrate and the support; and
a detection section for detecting rubbing between a substrate and the support based on a detection signal from a vibration sensor which detects a solid-borne sound, propagating through the substrate holding tool, and outputs the detection signal.

* * * * *